(12) United States Patent
Soliman et al.

(10) Patent No.: US 12,549,191 B2
(45) Date of Patent: Feb. 10, 2026

(54) ANALOG-TO-DIGITAL CONVERTER DEVICE AND METHOD FOR OPERATING AN ANALOG-TO-DIGITAL CONVERTER DEVICE

(71) Applicant: Robert Bosch GmbH, Stuttgart (DE)

(72) Inventors: Taha Soliman, Renningen (DE); Tobias Kirchner, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 147 days.

(21) Appl. No.: 18/494,041

(22) Filed: Oct. 25, 2023

(65) Prior Publication Data

US 2025/0141463 A1    May 1, 2025

(30) Foreign Application Priority Data

Oct. 6, 2022  (DE) .................. 10-2022-210595.8

(51) Int. Cl.
H03M 1/14  (2006.01)
(52) U.S. Cl.
CPC ................... H03M 1/145 (2013.01)

(58) Field of Classification Search
CPC .......... H03M 1/12; H03M 1/14; H03M 1/142; H03M 1/145
See application file for complete search history.

(56) References Cited

U.S. PATENT DOCUMENTS

| | | | |
|---|---|---|---|
| 10,615,818 B1 | 4/2020 | Singh et al. | |
| 10,812,097 B1* | 10/2020 | Milicevic | H03M 1/36 |
| 2019/0123759 A1 | 4/2019 | Kumar et al. | |
| 2021/0226643 A1* | 7/2021 | Moon | H03M 1/742 |
| 2022/0045687 A1* | 2/2022 | Kozlov | H03F 3/45475 |
| 2022/0224347 A1 | 7/2022 | Manganaro et al. | |
| 2022/0334964 A1* | 10/2022 | Hu | G06N 3/063 |

* cited by examiner

*Primary Examiner* — Benyam Haile
(74) *Attorney, Agent, or Firm* — NORTON ROSE FULBRIGHT US LLP

(57) ABSTRACT

An analog-to-digital converter device designed to form a digital output signal based on an input current. The analog-to-digital converter device has a first analog-to-digital converter unit of a first type and a second analog-to-digital converter unit of a second type, wherein the first analog-to-digital converter unit is designed to receive the input current and, based on the input current, to form a first portion of the digital output signal and to output a first output current to the second analog-to-digital converter unit, wherein the second analog-to-digital converter unit is designed to form a second portion of the digital output signal based on the first output current.

12 Claims, 14 Drawing Sheets

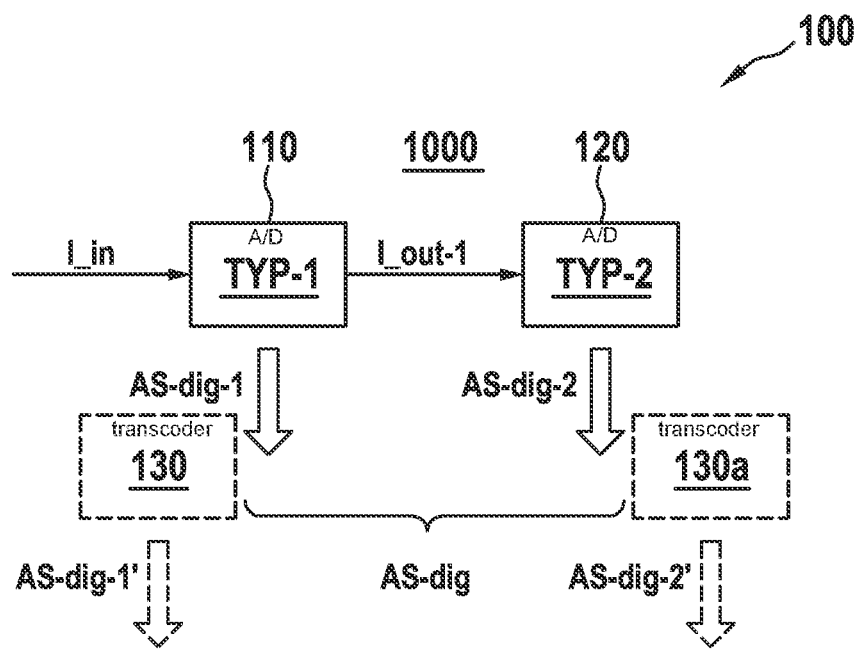
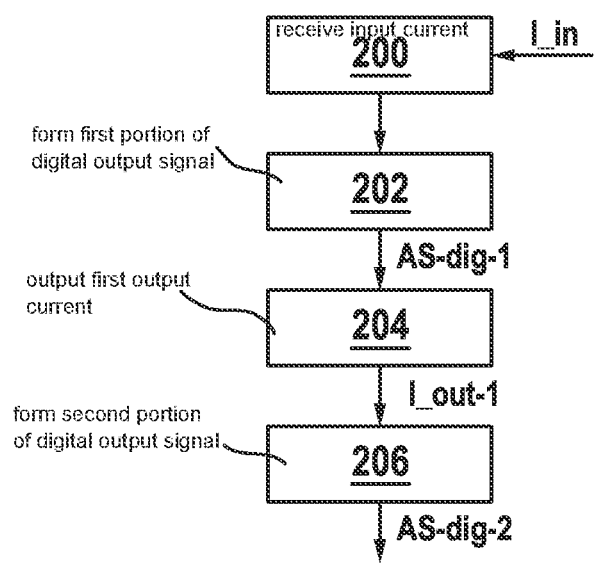

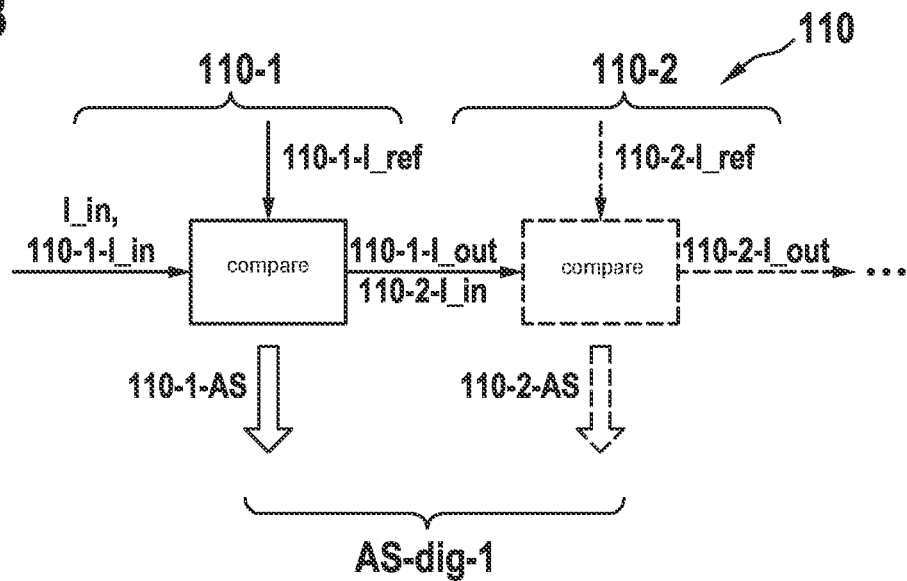
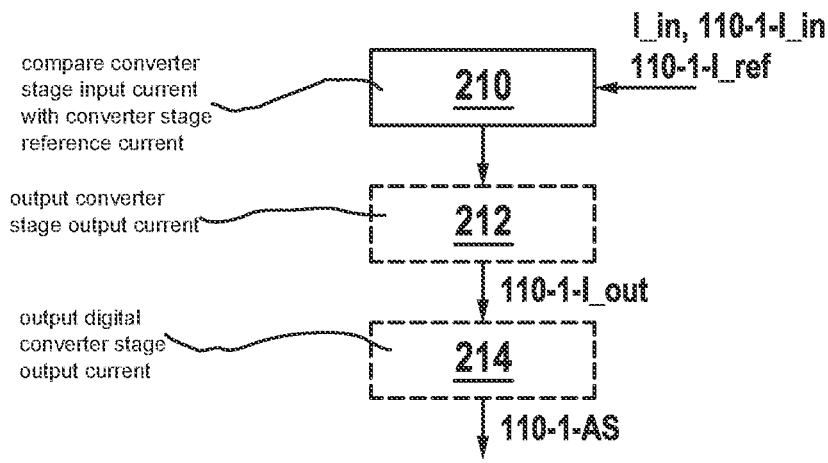

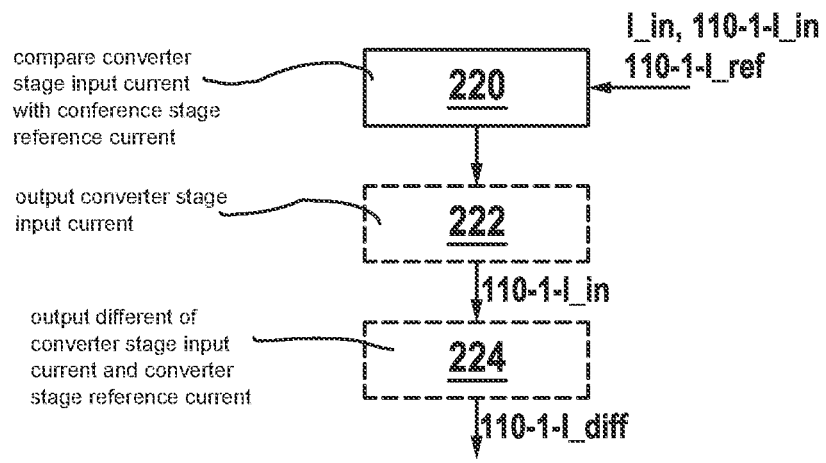
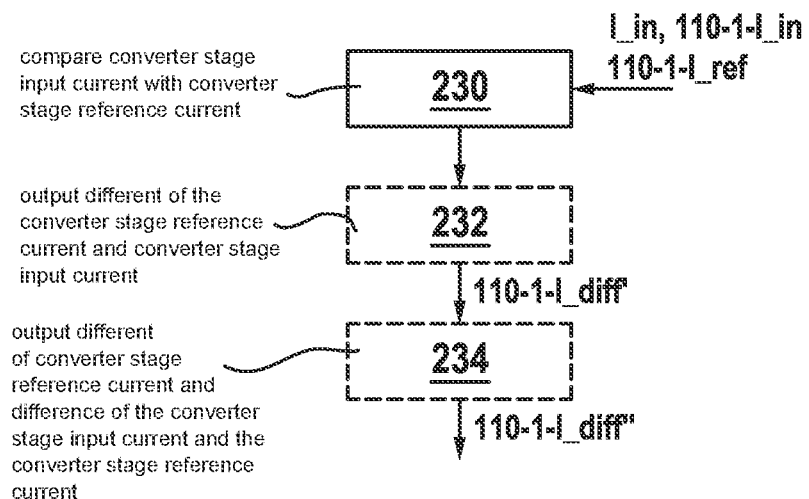

ANALOG-TO-DIGITAL CONVERTER DEVICE AND METHOD FOR OPERATING AN ANALOG-TO-DIGITAL CONVERTER DEVICE

FIELD

The present invention relates to an analog-to-digital converter device.

The present invention furthermore relates to a method for operating an analog-to-digital converter device.

SUMMARY

Exemplary embodiments of the present invention relate to an analog-to-digital converter device, which is designed to form a digital output signal based on an input current, wherein the analog-to-digital converter device has a first analog-to-digital converter unit of a first type and a second analog-to-digital converter unit of a second type, wherein the first analog-to-digital converter unit is designed to receive the input current and, based on the input current, to form a first portion of the digital output signal and to output a first output current to the second analog-to-digital converter unit, wherein the second analog-to-digital converter unit is designed to form a second portion of the digital output signal based on the first output current. In further exemplary embodiments, this enables degrees of freedom in providing the analog-to-digital converter device, for example by selecting the first analog-to-digital converter unit and/or the second analog-to-digital converter unit.

In further exemplary embodiments of the present invention, it is provided that the second type is different from the first type, wherein, for example, a hybrid analog-to-digital converter device having different types of (for example, first and second) analog-to-digital converter units can be provided.

In further exemplary embodiments of the present invention, the first analog-to-digital converter unit can, for example, be optimized for operation with a comparatively large input current, while the second analog-to-digital converter unit can, for example, be optimized for operation with a comparatively small first output current.

In further exemplary embodiments of the present invention, the digital output signal can, for example, have M bits, wherein, for example, the first portion of the digital output signal has m1>=1 bits, wherein, for example, the second portion of the digital output signal has m2>=1 bits. In further exemplary embodiments, m1=m2 can apply. In further exemplary embodiments, m1<m2 or m1>m2 can apply.

In further exemplary embodiments of the present invention, it is provided that the first analog-to-digital converter unit has at least one converter stage, wherein the at least one converter stage is designed to compare a converter stage input current (for example, the input current of the analog-to-digital converter device) that can be fed to the at least one converter stage, with a converter stage reference current associated with the at least one converter stage, and, based on the comparison, a) to output a converter stage output current, and/or b) to output a digital converter stage output signal.

In further exemplary embodiments of the present invention, it is provided that the first analog-to-digital converter unit has n, n>1, converter stages, wherein a first converter stage of the n converter stages is designed to compare a converter stage input current that can be fed to the first converter stage, with a converter stage reference current associated with the first converter stage, and, based on the comparison, a) to output a first converter stage output current as the input current for a second converter stage, and/or b) to output a first digital converter stage output signal.

In further exemplary embodiments of the present invention, for example in the case of more than two converter stages, the second converter stage and/or at least one further converter stage can is, for example, designed to compare a converter stage input current that can be fed to the relevant converter stage, with a converter stage reference current associated with the relevant converter stage, and, based on the comparison, a) to output a converter stage output current as the input current for a converter stage following the relevant converter stage, and/or b) to output a digital converter stage output signal for the relevant converter stage.

In further exemplary embodiments of the present invention, it is provided that the at least one converter stage is designed to compare the converter stage input current with the converter stage reference current and, if the converter stage input current is smaller than the converter stage reference current, to output the converter stage input current as the converter stage output current and, if the converter stage input current is greater than or equal to the converter stage reference current, to output a difference of the converter stage input current and the converter stage reference current as the converter stage output current. Thus, in further exemplary embodiments, a binary coding of the first portion of the digital output signal can be obtained, for example.

In further exemplary embodiments of the present invention, it is provided that the at least one converter stage is designed to compare the converter stage input current with the converter stage reference current and, if the converter stage input current is smaller than the converter stage reference current, to output a difference of the converter stage reference current and the converter stage input current as the converter stage output current and, if the converter stage input current is greater than or equal to the converter stage reference current, to output a difference of the converter stage reference current and a difference of the converter stage input current and the converter stage reference current as the converter stage output current. Thus, in further exemplary embodiments, Gray coding of the first portion of the digital output signal can be obtained, for example.

In further exemplary embodiments of the present invention, it is provided that the first analog-to-digital converter unit is designed to output the first portion of the digital output signal as a Gray-coded signal, wherein a transcoding device is optionally provided, which is designed to transcode the Gray-coded signal, for example into a binary-coded signal.

In further exemplary embodiments of the present invention, it is provided that a current mirror device is provided for outputting the first output current to the second analog-to-digital converter unit, as a result of which, in further exemplary embodiments, a suitable current direction of the first output current can, for example, be provided for the second analog-to-digital converter unit.

In further exemplary embodiments of the present invention, it is provided that the second analog-to-digital converter unit is designed to provide the second portion of the digital output signal as a unary-coded signal (for example, according to a thermometer code), wherein a transcoding device that is designed to transcode the unary-coded signal, for example into a binary-coded signal, is optionally provided.

In further exemplary embodiments of the present invention, it is provided that the first analog-to-digital converter unit and the second analog-to-digital converter unit are arranged on a same substrate, for example semiconductor substrate.

Further exemplary embodiments of the present invention relate to a computing device, for example for determining a scalar product, for example vector matrix multiplier, for example dot product engine, having a matrix of elements with a controllable electrical resistor, and at least one analog-to-digital converter device according to exemplary embodiments.

Further exemplary embodiments of the present invention relate to a method for operating an analog-to-digital converter device, which is designed to form a digital output signal based on an input current, wherein the analog-to-digital converter device has a first analog-to-digital converter unit of a first type and a second analog-to-digital converter unit of a second type, wherein the second type is different from the first type, wherein the first analog-to-digital converter unit receives the input current and, based on the input current, forms a first portion of the digital output signal and outputs a first output current to the second analog-to-digital converter unit, wherein the second analog-to-digital converter unit forms a second portion of the digital output signal based on the first output current.

Further exemplary embodiments of the present invention relate to a use of the analog-to-digital converter device according to the embodiments and/or of the computing device according to the embodiments and/or of the method according to the embodiments for at least one of the following elements: a) converting a current into a binary value, b) performing a binary encoding, c) providing a, for example completely, current-driven, for example hybrid, analog-to-digital converter.

Further features, possible applications and advantages of the present invention will be apparent from the following description of exemplary embodiments of the present invention shown in the figures. In this case, all of the features described or shown form the subject matter of the present invention individually or in any combination, irrespective of their wording or representation in the description or in the figures.

BRIEF DESCRIPTION OF THE DRAWINGS

FIG. 1 schematically shows a simplified block diagram according to exemplary embodiments of the present invention.

FIG. 2 schematically shows a simplified flow diagram according to exemplary embodiments of the present invention.

FIG. 3 schematically shows a simplified block diagram according to exemplary embodiments of the present invention.

FIG. 4 schematically shows a simplified flow diagram according to exemplary embodiments of the present invention.

FIG. 5 schematically shows a simplified flow diagram according to exemplary embodiments of the present invention.

FIG. 6 schematically shows a simplified flow diagram according to exemplary embodiments of the present invention.

DETAILED DESCRIPTION OF EXAMPLE EMBODIMENTS

Figure 7:
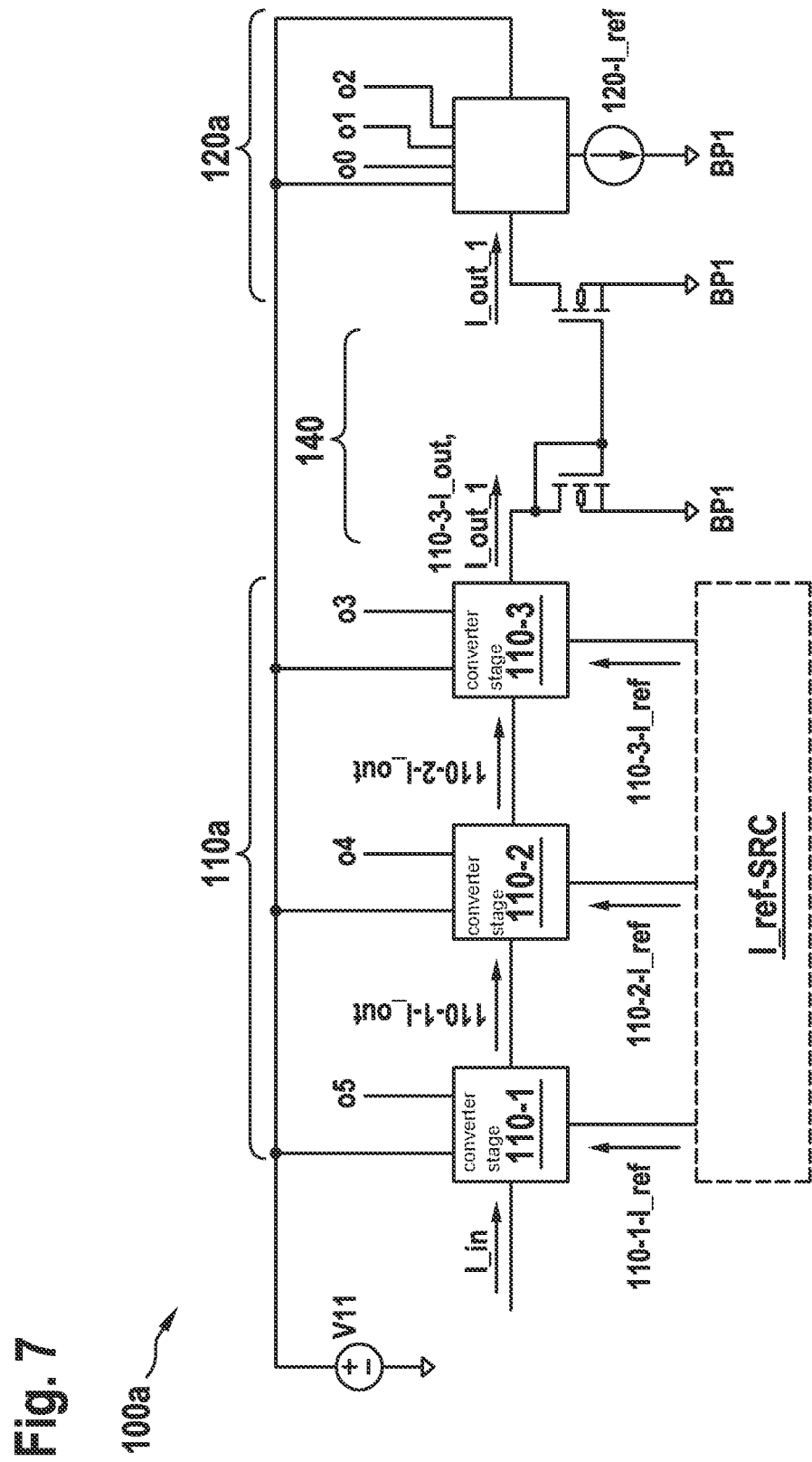
FIG. 7 schematically shows a simplified circuit diagram according to exemplary embodiments of the present invention.

Exemplary embodiments, see FIGS. 1 and 2, relate to an analog-to-digital converter device 100, which is designed to form a digital output signal AS-dig based on an input current I_in, wherein the analog-to-digital converter device 100 has a first analog-to-digital converter unit 110 of a first type TYP-1 and a second analog-to-digital converter unit 120 of a second type TYP-2, wherein the first analog-to-digital converter unit 110 is designed to receive 200 the input current I_in (FIG. 2) and, based on the input current I_in, to form 202 a first portion AS-dig-1 of the digital output signal AS-dig and to output 204 (FIG. 2) a first output current I_out-1 (FIG. 1) to the second analog-to-digital converter unit 120, wherein the second analog-to-digital converter unit 120 is designed to form 206 a second portion AS-dig-2 of the digital output signal AS-dig based on the first output current I_out-1. In further exemplary embodiments, this enables degrees of freedom in providing the analog-to-digital converter device 100, for example by selecting the first analog-to-digital converter unit 110 and/or the second analog-to-digital converter unit 120.

In further exemplary embodiments, the first portion AS-dig-1 and the second portion AS-dig-2 together yield the digital output signal AS-dig, obtainable, for example, by concatenation of both portions AS-dig-1, AS-dig-2, for example in the case of binary coding of the respective portions AS-dig-1, AS-dig-2.

In further exemplary embodiments, FIG. 1, it is provided that the second type TYP-2 is different from the first type TYP-1, wherein, for example, a hybrid analog-to-digital converter device 100 can be provided, which has different types of (for example, first and second) analog-to-digital converter units 110, 120.

In further exemplary embodiments, FIG. 1, the first analog-to-digital converter unit 110 can, for example, be optimized for operation with a comparatively large input current I_in, while the second analog-to-digital converter unit 120 can, for example, be optimized for operation with a comparatively small first output current I_out-1.

In further exemplary embodiments, FIG. 1, the digital output signal AS-dig can, for example, have M bits, wherein, for example, the first portion AS-dig-1 of the digital output signal AS-dig has m1>=1 bits, wherein, for example, the second portion AS-dig-2 of the digital output signal AS-dig has m2>=1 bits. In further exemplary embodiments, m1=m2 can apply. In further exemplary embodiments, m1<m2 or m1>m2 can apply.

In further exemplary embodiments, FIG. 3, it is provided that the first analog-to-digital converter unit 110 has at least one converter stage 110-1, wherein the at least one converter stage 110-1 is designed to compare 210 a converter stage input current 110-1-I_in (for example, the input current I_in of the analog-to-digital converter device 100, see also FIG. 1) that can be fed to the at least one converter stage 110-1, with a converter stage reference current 110-1-I_ref associated with the at least one converter stage 110-1, see FIG. 4, and, based on the comparison 210, a) to output 212 a converter stage output current 110-1-I_out, and/or b) to output 214 a digital converter stage output signal 110-1-AS.

In further exemplary embodiments, in which exactly one converter stage 110-1 is provided for the first analog-to-digital converter unit 110, the converter stage output current 110-1-I_out of the converter stage 110-1 can be output as a first output current I_out-1 to the second analog-to-digital converter unit 120 (FIG. 1).

In further exemplary embodiments, in which more than the one converter stage 110-1 is provided for the first analog-to-digital converter unit 110, the converter stage output current 110-1-I_out of the converter stage 110-1 of a subsequent converter stage 110-2 can be output as a corresponding input current 110-2-I_in to the second converter stage 110-2, etc.

In further exemplary embodiments, FIG. 3, it is provided that the first analog-to-digital converter unit 110 has n, n>1, converter stages 110-1, 110-2, . . . , wherein a first converter stage 110-1 of the n converter stages is designed to compare a converter stage input current 110-1-I_in that can be fed to the first converter stage 110-1, with a converter stage reference current 110-1-I_ref associated with the first converter stage 110-1, and, based on the comparison, a) to output a first converter stage output current 110-1-I_out as the input current 110-2-I_in for a second converter stage 110-2, and/or b) to output a first digital converter stage output signal 110-1-AS.

In further exemplary embodiments, FIG. 3, for example in the case of more than two converter stages, the second converter stage 110-2 and/or at least one further converter stage can, for example, be designed to compare a converter stage input current 110-2-I_in that can be fed to the relevant converter stage 110-2, with a converter stage reference current 110-2-I_ref associated with the relevant converter stage 110-2, and, based on the comparison, a) to output a converter stage output current 110-2-I_out as the input current for a converter stage following the relevant converter stage, and/or b) to output a digital converter stage output signal 110-2-AS for the relevant converter stage 110-2.

In further exemplary embodiments, FIG. 5, it is provided that the at least one converter stage 110-1 (FIG. 3) is designed to compare 220 the converter stage input current 110-1-I_in with the converter stage reference current 110-1-I_ref and, if the converter stage input current 110-1-I_in is smaller than the converter stage reference current 110-1-I_ref, to output 222 the converter stage input current 110-1-I_in as the converter stage output current 110-1-I_out and, if the converter stage input current 110-1-I_in is greater than or equal to the converter stage reference current 110-1-I_ref, to output 224 a difference 110-1-I_diff (for example, I_in-I_ref) of the converter stage input current 110-1-I_in and the converter stage reference current 110-1-I_ref as the converter stage output current 110-1-I_out. Thus, in further exemplary embodiments, a binary coding of the first portion AS-dig-1 of the digital output signal AS-dig can be obtained, for example. In further exemplary embodiments, all converter stages 110-1, 110-2, . . . can, for example, be designed to perform such binary coding.

An exemplary circuit realization of the converter stages 110-1, 110-2, . . . , for example for binary coding, according to further exemplary embodiments is described further below with reference to FIGS. 14, 15.

In further exemplary embodiments, FIG. 6, it is provided that the at least one converter stage 110-1 is designed to compare 230 the converter stage input current 110-1-I_in with the converter stage reference current 110-1-I_ref and, if the converter stage input current 110-1-I_in is smaller than the converter stage reference current 110-1-I_ref, to output 232 (FIG. 6) a difference 110-1-I_diff' (for example, according to I_ref-I_in) of the converter stage reference current 110-1-I_ref and the converter stage input current 110-1-I_in as the converter stage output current 110-1-I_out (see also FIG. 3) and, if the converter stage input current 110-1-I_in is greater than or equal to the converter stage reference current 110-1-I_ref, to output 234 a difference 110-1-I_diff" (for example, according to I_ref-(I_in-I_ref)) of the converter stage reference current 110-1-I_ref and a difference of the converter stage input current 110-1-I_in and the converter stage reference current 110-1-I_ref, for example according to as the converter stage output current. Thus, in further exemplary embodiments, Gray coding of the first portion of the digital output signal can be obtained, for example.

An exemplary circuit realization of the converter stages 110-1, 110-2, . . . , for example for Gray coding, according to further exemplary embodiments is described further below with reference to FIGS. 16, 17.

In further exemplary embodiments, FIG. 1, it is provided that the first analog-to-digital converter unit 110 is designed to output the first portion AS-dig-1 of the digital output signal AS-dig as a Gray-coded signal, wherein a transcoding device 130 is optionally provided, which is designed to transcode the Gray-coded signal AS-dig-1, for example into a binary-coded signal AS-dig-1'.

Figure 8:
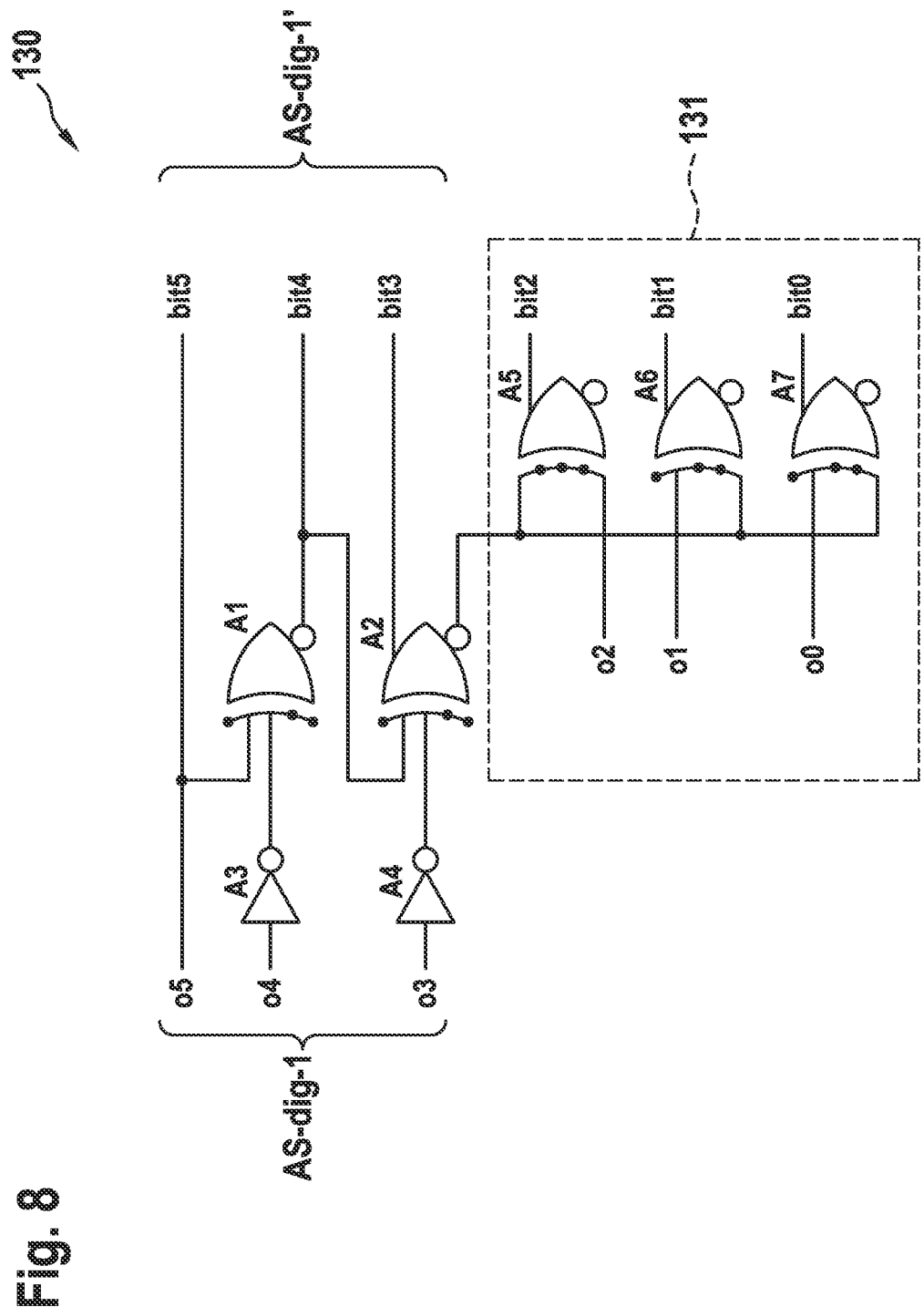
FIG. 8 schematically shows a simplified circuit diagram according to exemplary embodiments of the present invention.

FIG. 7 schematically shows a simplified circuit diagram according to exemplary embodiments. The analog-to-digital converter device 100*a* according to FIG. 7 has a first analog-to-digital converter unit 110*a*, which is designed to output the first portion AS-dig-1 (FIG. 1) of the digital output signal AS-dig as a Gray-coded signal, in the present case, for example, with three bits o3, o4, o5, wherein a transcoding device 130, see FIG. 8, is optionally provided, which is designed to transcode the Gray-coded signal AS-dig-1, for example into a binary-coded signal AS-dig-1' with the three bits bit3, bit4, bit5.

In further exemplary embodiments, FIG. 7, the analog-to-digital converter device 100*a* according to FIG. 7 can be fed with the input current I_in, which can, for example, be a current Ia, Ib, Ic to be measured of a computing device 10, see below for FIG. 12. The first converter stage 110-1 receives the input current I_in, compares it with a reference current 110-1-I_ref associated with the first converter stage 110-1, and, based on the comparison, outputs an output current 110-1–I_out, which, depending on the result of the comparison, is, for example, the difference 110-1–I_diff' or the difference 110-1–I_diff" according to FIG. 6. The output current 110-1–I_out forms the input current for the second converter stage 110-2, which operates analogously to the first converter stage 110-1, but with, for example, a reference current 110-2–I_ref individually associated with the second converter stage 110-2. The output current 110-2–I_out of the second converter stage 110-2 forms the input current for the third converter stage 110-3, which operates analogously to the first and second converter stages, but, for example, with a reference current 110-3–I_ref individually associated with the third converter stage 110-3.

For example, each of the converter stages 110-1, 110-2, 110-3 thus provides one bit each of a Gray-coded portion AS-dig-1 (FIG. 1) of the digital output signal AS-dig, wherein the signal o5 of the converter stage 110-1 corresponds to a most significant bit, MSB.

The voltage source V11 symbolizes an operating voltage potential, for example for an operating voltage supply of at least some components 110a, 120a according to FIG. 7.

Figure 14:
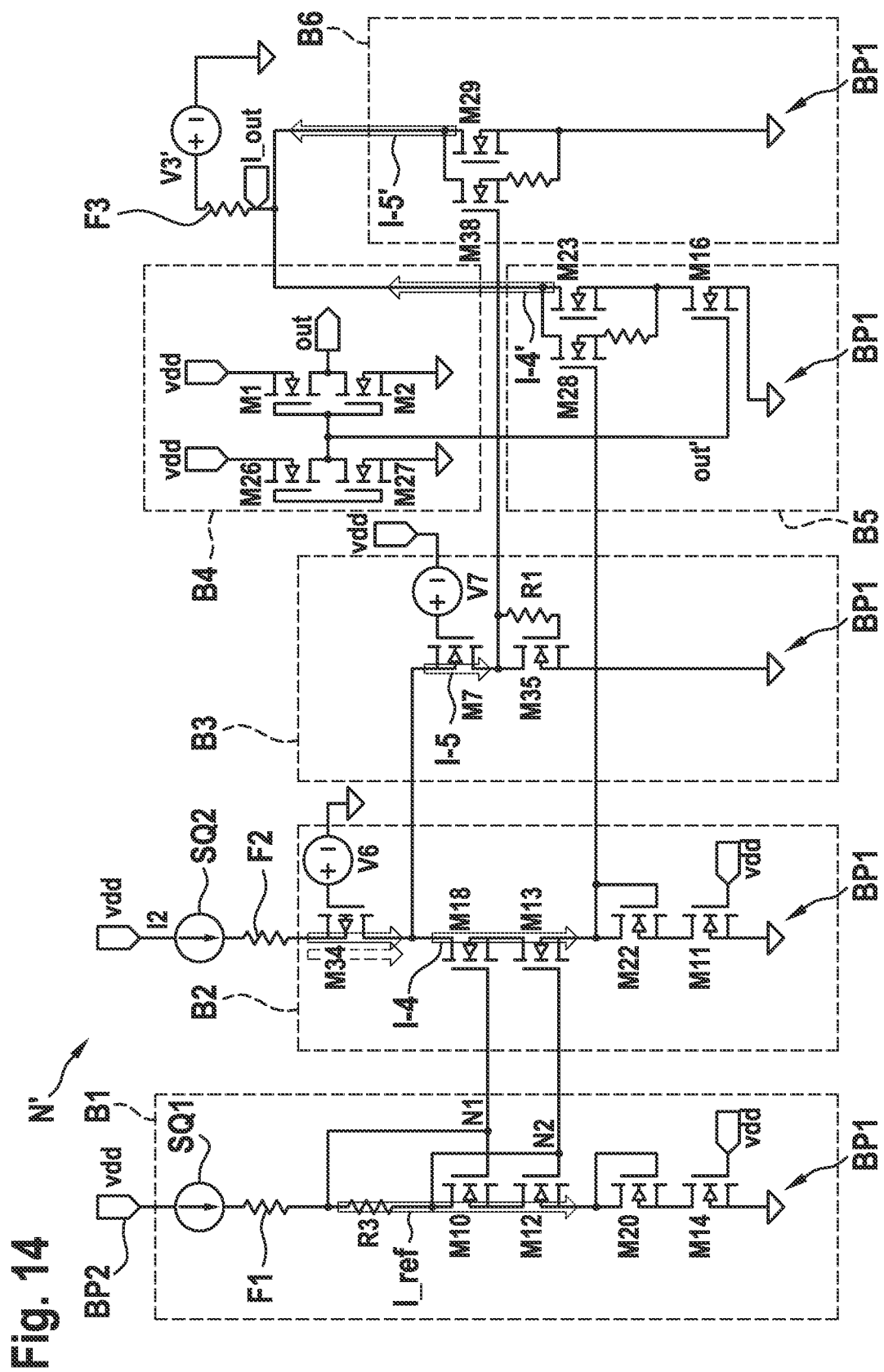
FIG. 14 schematically shows a simplified circuit diagram according to exemplary embodiments of the present invention.
Figure 15:
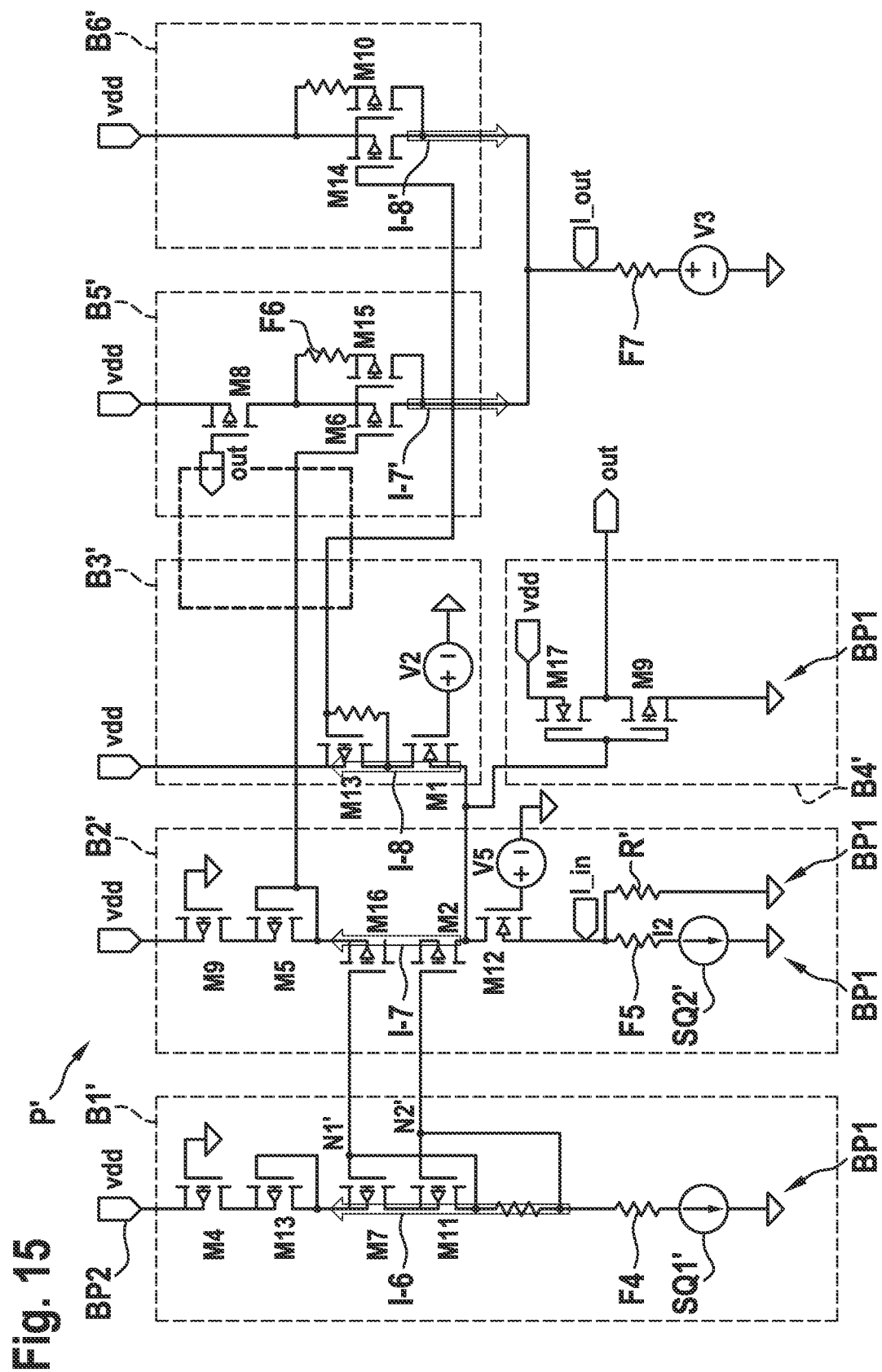
FIG. 15 schematically shows a simplified circuit diagram according to exemplary embodiments of the present invention.

In further exemplary embodiments, an exemplary circuit realization of the converter stages 110-1, 110-2, 110-3 according to FIG. 7 can be realized, for example, as described by way of example in FIGS. 14, 15, wherein FIG. 14 shows an exemplary configuration N' for a circuit realization of converter stages in a first polarity configuration, type "N," and wherein FIG. 15 shows an exemplary configuration P' for a circuit realization of converter stages in a second polarity configuration, type "P."

For example, in a bipolar configuration according to further exemplary embodiments of the first analog-to-digital converter unit 110a according to FIG. 7, the first converter stage 110-1 can have the second polarity configuration "P," the second converter stage 110-2 can have the first polarity configuration "N," and the third converter stage 110-3 can have the second polarity configuration "P."

In further exemplary embodiments, a bipolar configuration of the first analog-to-digital converter unit 110a requires, for example, comparatively low quiescent currents.

In further exemplary embodiments, all converter stages of the first analog-to-digital converter unit 110a can also have the same polarity configuration ("N" or "P").

In further exemplary embodiments, FIG. 7, each converter stage 110-1, 110-2, 110-3 has an input (for example, for receiving the respective input current I_in, 110-1–I_out, 110-2–I_out).

In further exemplary embodiments, FIG. 7, each converter stage 110-1, 110-2, 110-3 has a first output (for example, for outputting a respective output current 110-1–I_out, 110-2–I_out, 110-3–I_out, i.e., for example, residual current, for example according to the exemplary difference formation according to FIG. 5 or 6).

In further exemplary embodiments, FIG. 7, each converter stage 110-1, 110-2, 110-3 has a second output (for example, for outputting a respective digital output signal, for example, bits o5, o4, o3).

In further exemplary embodiments, FIG. 7, a respective reference current 110-1–I_ref, 110-2–I_ref, 110-3–I_ref can be fed to each converter stage 110-1, 110-2, 110-3. In further exemplary embodiments, at least one reference current source I_ref-SRC can be provided for providing at least one reference current 110-1–I_ref, 110-2–I_ref, 110-3–I_ref.

In further exemplary embodiments, the respective reference currents 110-1–I_ref, 110-2–I_ref, 110-3–I_ref, can, for example, each be equal in magnitude, or different, for example based on a respective significance of the corresponding converter stage 110-1, 110-2, 110-3.

In further exemplary embodiments, the reference current 110-1–I_ref for the first converter stage 110-1 can, for example, have a first reference current value W_REF-1, and the reference current 110-2–I_ref for the second converter stage 110-2 has a second reference current value W_REF-2=W_REF-1/2 that is half as large, and the reference current 110-3–I_ref for the third converter stage 110-3 has a third reference current value W_REF-3=W_REF-2/2 that is half as large.

Figure 17:
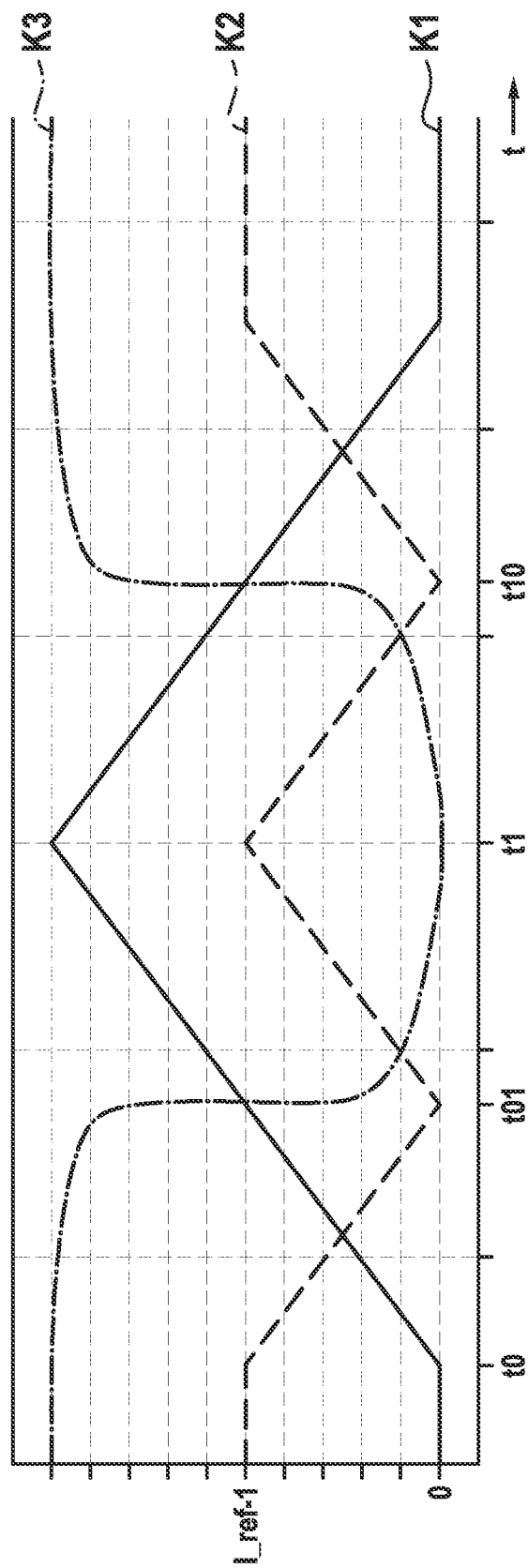
FIG. 17 schematically shows a simplified time diagram according to exemplary embodiments of the present invention.

In further exemplary embodiments, the use of a Gray-coded portion AS-dig-1 of the digital output signal AS-dig advantageously requires that the respective output currents 110-1–I_out, 110-2–I_out, 110-3–I_out of the individual converter stages 110-1, 110-2, 110-3 do not exhibit any value jumps or steep flanks, which can be advantageous in further exemplary embodiments, for example, for a real implementation (for example, due to a comparatively low bandwidth), see also FIG. 17, for example.

FIG. 8 shows, by way of example, a transcoding device 130, which is designed to transcode the Gray-coded signal o3, o4, o5 (see also FIG. 7) of the first analog-to-digital converter unit 110a, for example into a binary-coded signal (AS-dig-1') with bits bit3, bit4, bit5.

The transcoding device 130 according to FIG. 8 has a plurality of logic elements A1, A2, A3, A4, A5, A6, A7, although alternative configurations with equivalent function are also possible in further exemplary embodiments.

The transcoding device 130 according to FIG. 8 has a controllable inverter device 131, which is designed to output binary-coded bits bit0, bit1, bit2 based on the second portion AS-dig-2 (FIG. 1) of the digital output signal As-dig, as obtainable, for example, by means of the second analog-to-digital converter unit 120a according to FIG. 7 in the form of the bits o0, o1, o2.

In further exemplary embodiments, the inverter device 131 can, for example, advantageously be used if the first analog-to-digital converter unit 110a performs Gray coding, because the second analog-to-digital converter unit 120a in this case outputs a correct bit pattern bit0, bit1, bit2 for input currents I_in that are smaller than the reference current 110-1–I_ref, but an inverted bit pattern for input currents I_in that are greater than or equal to the reference current 110-1–I_ref, which can be compensated for, for example, by the controllable inverter device 131.

In further exemplary embodiments, FIG. 7, it is provided that a current mirror device 140 is provided for outputting the first output current I_out_1 to the second analog-to-digital converter unit 120a, as a result of which, in further exemplary embodiments, a suitable current direction of the first output current I_out_1 can, for example, be provided for the second analog-to-digital converter unit 120a.

Reference sign BP1 symbolizes, by way of example, a first reference potential, for example ground potential, according to further exemplary embodiments.

In further exemplary embodiments, FIG. 7, it is provided that the second analog-to-digital converter unit 120a is designed to provide the second portion AS-dig-2 (FIG. 1) of the digital output signal AS-dig as a unary-coded signal (for example, according to a thermometer code), wherein a transcoding device 130a is optionally provided, which is designed to transcode the unary-coded signal AS-dig-2, for example characterized by the three bits o0, o1, o2 according to FIG. 7, for example into a binary-coded signal.

Figure 9:
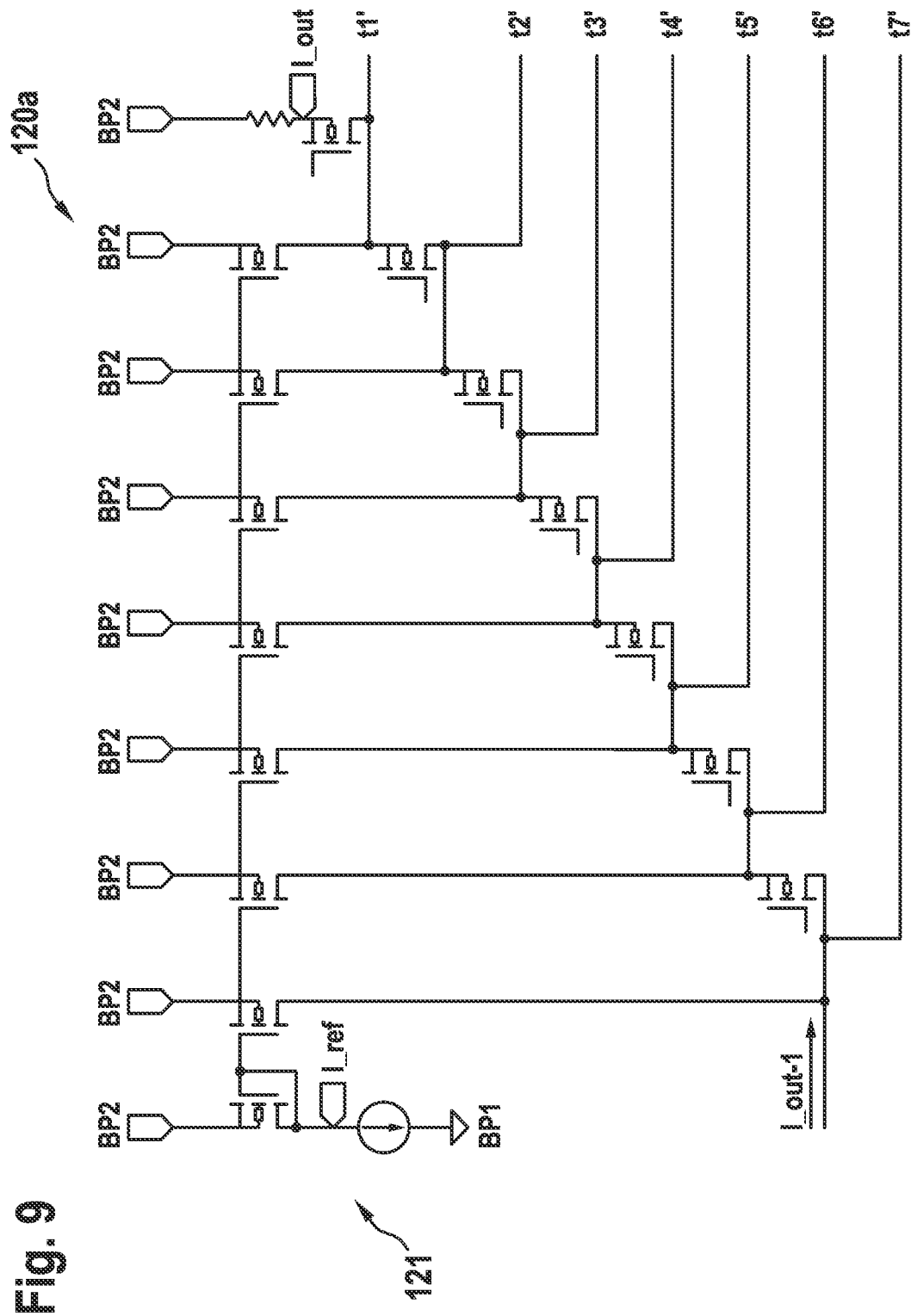
FIG. 9 schematically shows a simplified circuit diagram according to exemplary embodiments of the present invention.

FIG. 9 illustrates aspects of an exemplary circuit realization of the second analog-to-digital converter unit 120a, for example as a thermometer code analog-to-digital converter unit, according to further exemplary embodiments. The second analog-to-digital converter unit 120*a* can be fed with the first output current I_out-1 as an input signal, as provided by the first analog-to-digital converter unit 110*a*, for example. A plurality of field-effect transistors, not individually designated, is connected, by way of example as shown, such that it performs a unary coding, for example in the sense of a thermometer code, of the input signal I_out-1, wherein digital output signals t1', t2', t3', t4', t5', t6', t7' each having one bit are obtained.

Reference sign 121 symbolizes an optional conversion of a reference current according to further exemplary embodiments into a bias voltage for at least some of the field-effect transistors.

In further exemplary embodiments, the reference current can, for example, be selected separately, for example individually, or can be derived from one of the references already used in the circuit, if any. In further exemplary embodiments, this is possible, for example, by connecting the gate of the transistor 121 to a gate voltage of, for example, another reference, for example if the reference current is converted into a gate voltage.

In further exemplary embodiments, a magnitude of the reference current can be selected, for example, together with the design, i.e., for example, of the gate dimensions of the transistors (FIG. 9, by way of example, P-channel), to achieve a desired current sensitivity. Thus, for example, if one wishes to reuse an existing reference current or an existing voltage, matching to the desired conversion range can, for example, be achieved in further exemplary embodiments via the dimensioning of the transistors 121 in FIG. 9.

Figure 10:
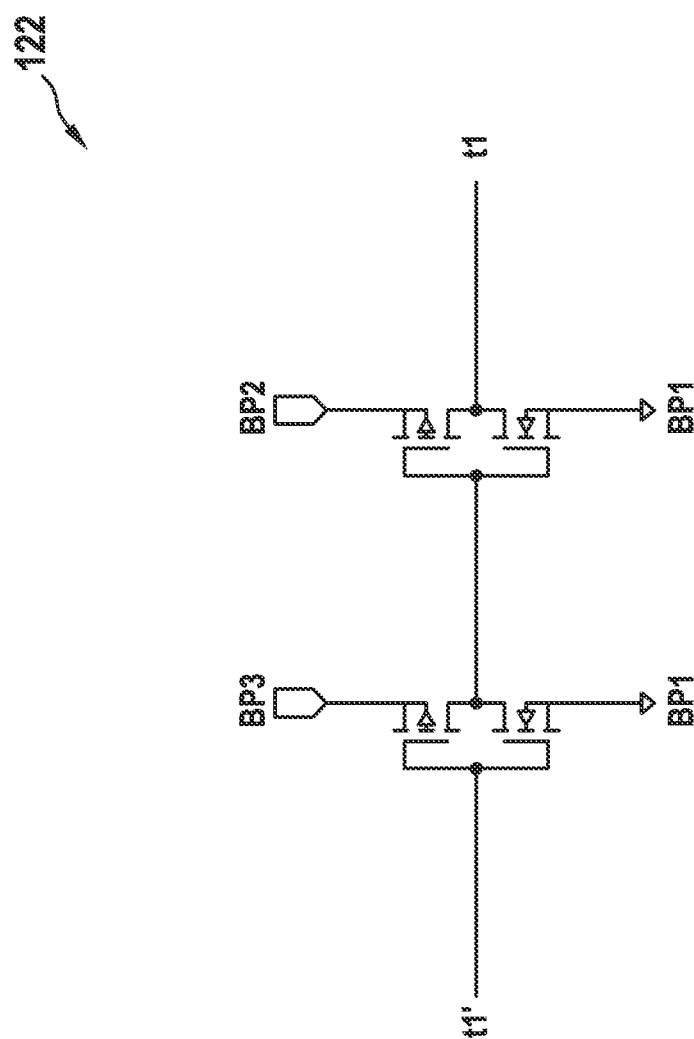
FIG. 10 schematically shows a simplified circuit diagram according to exemplary embodiments of the present invention.

In further exemplary embodiments, one or more of the digital output signals t1', t2', t3', t4', t5', t6', t7' can be buffered, for example each by means of a buffer circuit 122 as shown, by way of example, in FIG. 10.

Reference sign BP3 symbolizes a further operating voltage potential, which is different from the reference potentials BP1, BP2, for example.

In the present case, FIG. 10 shows how the signal t1' is buffered according to FIG. 9, as a result of which the buffered signal t1 is obtained. In further exemplary embodiments, one or more further, for example all, output signals t1', t2', t3', t4', t5', t6', t7' can also be buffered by means of the configuration shown, by way of example, in FIG. 10. In further exemplary embodiments, corresponding buffer circuits 122 (FIG. 10) can, for example, also be integrated directly into the circuit 120*a* according to FIG. 9 (not shown).

In further exemplary embodiments, the first analog-to-digital converter unit 110 (FIG. 1) and the second analog-to-digital converter unit 120 can, for example, each be supplied with different operating voltages.

In further exemplary embodiments, the first analog-to-digital converter unit 110 (FIG. 1) and the second analog-to-digital converter unit 120 can, for example, be supplied with a common operating voltage.

In further exemplary embodiments, FIG. 1, it is provided that the first analog-to-digital converter unit 110 and the second analog-to-digital converter unit 120 are arranged on a same substrate, for example semiconductor substrate.

Figure 11:
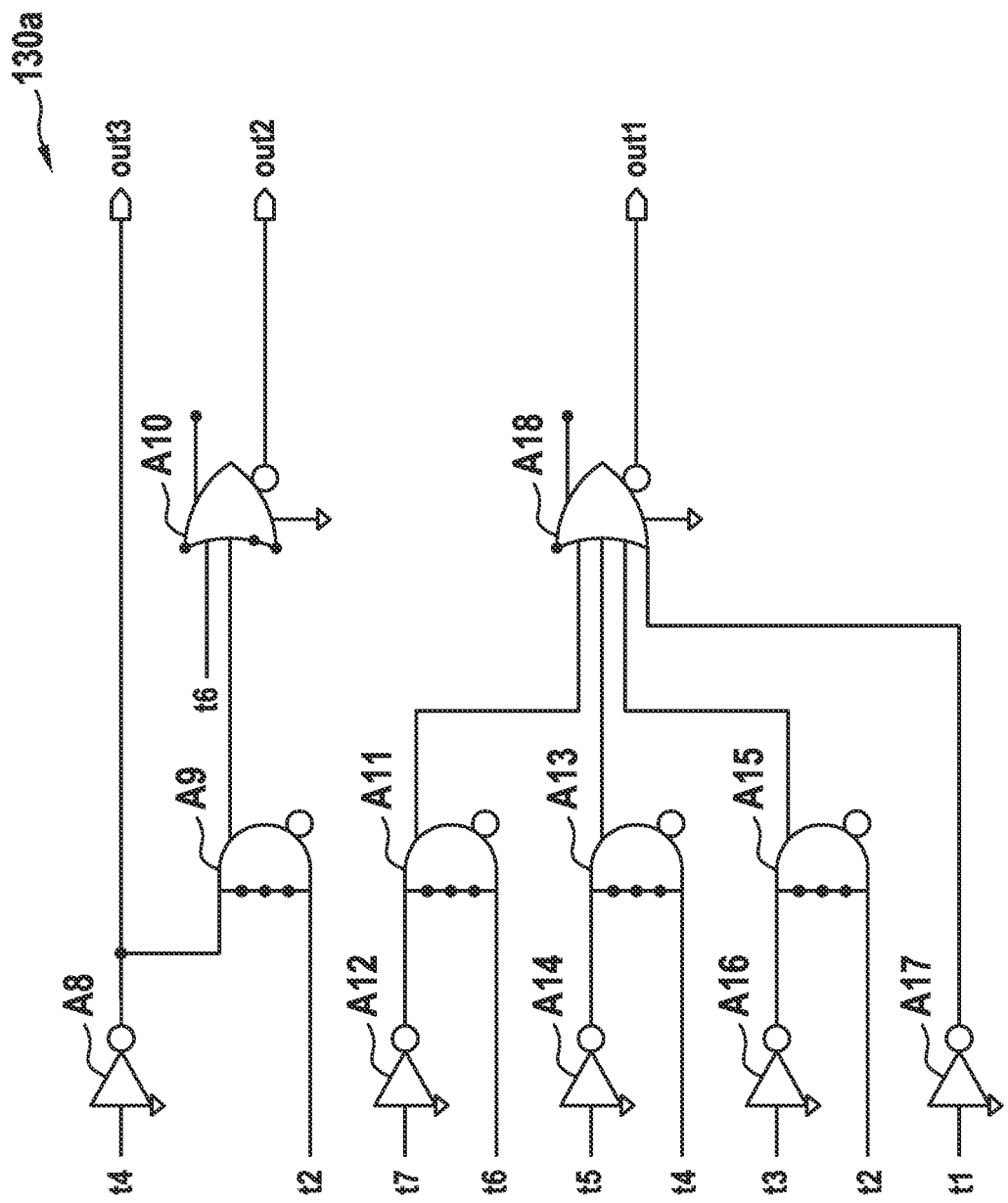
FIG. 11 schematically shows a simplified circuit diagram according to exemplary embodiments of the present invention.

FIG. 11 schematically shows aspects of an exemplary circuit realization of a transcoding device 130*a*, which is designed to transcode the (possibly buffered) unary-coded signal t1, t2, ..., t7 (for example, thermometer code), for example into a binary-coded signal AS-dig-2', see also the individual bit signals out1, out2, out3 according to FIG. 11, which in further exemplary embodiments correspond, for example, to the signals o0, o1, o2 according to FIG. 7. The transcoding device 130*a* has, by way of example, the logic elements A8, A9, A10, A11, A12, A13, A14, A15, A16, A17, A18, as shown in FIG. 11. In further exemplary embodiments, alternative configurations with equivalent function can be provided.

Figure 12:
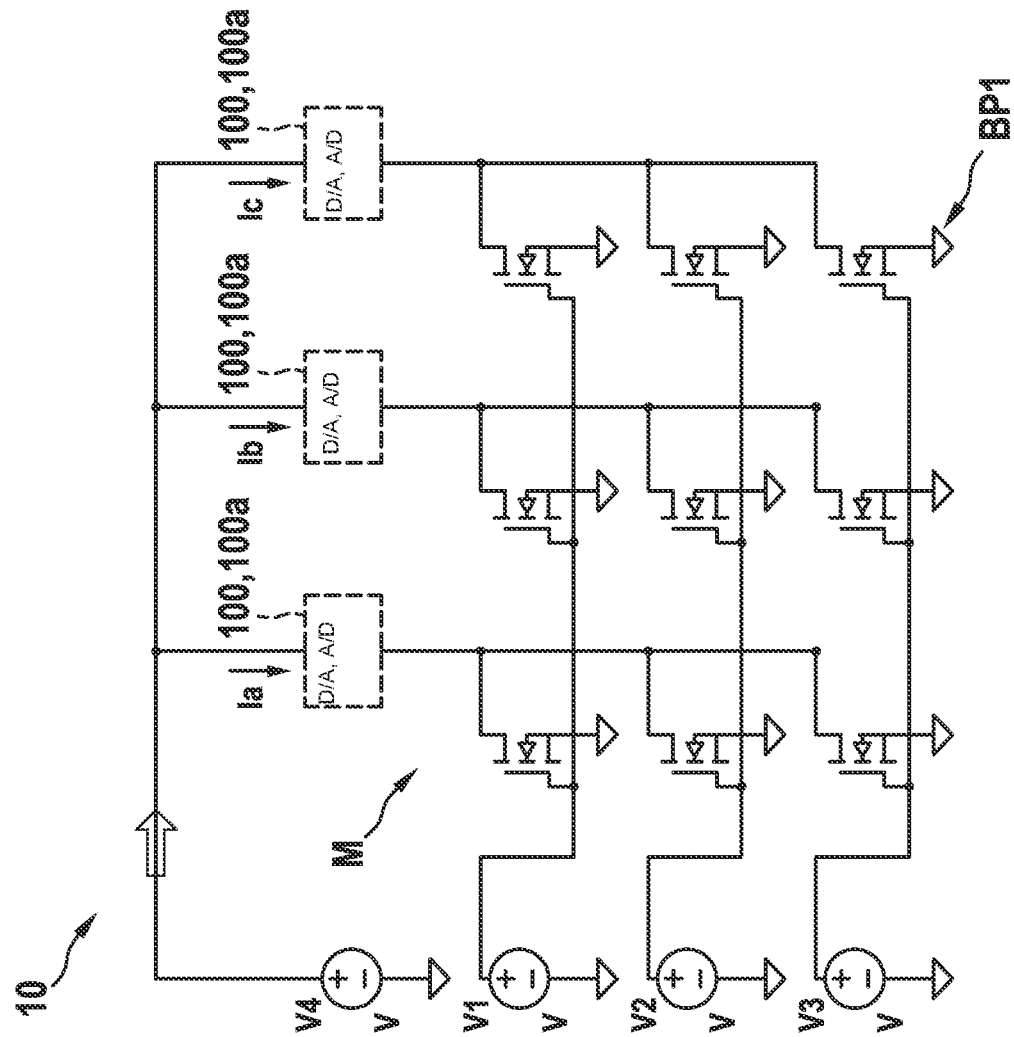
FIG. 12 schematically shows a simplified circuit diagram according to exemplary embodiments of the present invention.

Further exemplary embodiments, FIG. 12, relate to a computing device 10, for example for determining a scalar product, for example vector matrix multiplier, for example dot product engine, having a matrix M of elements with a controllable electrical resistor, and at least one analog-to-digital converter device 100, 100*a* according to exemplary embodiments.

As can be seen from FIG. 12, the analog-to-digital converter devices 100, 100*a* can be used, for example, for high-side current measurements, i.e., current measurements in the range of electrical potentials that are different from the ground potential, which is useful in the present case, for example, for determining the currents Ia, Ib, Ic. For example, the current Ia according to FIG. 12 can be fed to an analog-to-digital converter device 100, 100*a* as the input current I_in according to FIGS. 1, 3, 7.

Further exemplary embodiments, FIG. 2, relate to a method for operating an analog-to-digital converter device 100, 100*a*, which is designed to form a digital output signal AS-dig based on an input current I_in, wherein the analog-to-digital converter device has a first analog-to-digital converter unit 110, 110*a* of a first type and a second analog-to-digital converter unit 120, 120*a* of a second type, wherein the second type is different from the first type, wherein the first analog-to-digital converter unit receives 200 the input current (FIG. 2) and, based on the input current, forms 202 a first portion of the digital output signal and outputs 204 a first output current to the second analog-to-digital converter unit, wherein the second analog-to-digital converter unit forms 206 a second portion of the digital output signal based on the first output current.

In further exemplary embodiments, the portions AS-dig-1, AS-dig-2 can be combined to form the digital output signal AS-dig, for example by concatenation of the portions AS-dig-1, AS-dig-2, for example taking into account the significance of the respective bit signals, possibly after an optional transcoding, for example to a binary code.

Figure 13:
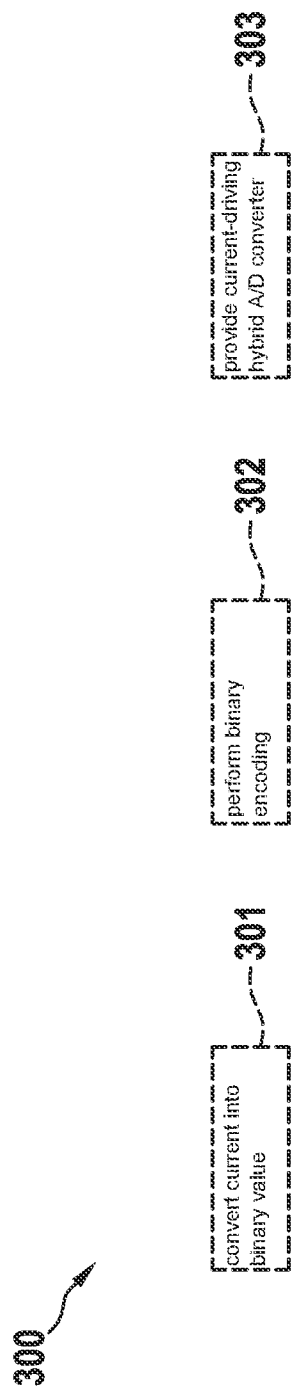
FIG. 13 schematically shows aspects of uses according to exemplary embodiments of the present invention.

Further exemplary embodiments, FIG. 13, relate to a use 300 of the analog-to-digital converter device 100, 100*a* according to the embodiments and/or of the computing device 10 according to the embodiments and/or of the method according to the embodiments for at least one of the following elements: a) converting 301 a current I_in into a binary value AS-dig, b) performing 302 a binary encoding, c) providing 303 a, for example completely, current-driven, for example hybrid, analog-to-digital converter 100, 100*a*.

FIG. 14 shows an exemplary configuration N' for a circuit realization of aspects of a converter stage 110-1, 110-2, 110-3, . . . of the first analog-to-digital converter unit 110, 110*a* according to further exemplary embodiments in a first polarity configuration, type "N."

In further exemplary embodiments, the configuration N' has at least one of the following elements: a) a conversion device B1, which is designed to generate a bias voltage, for example control voltage, based on a reference current, for example for a comparator device B2, b) a comparator device B2, which is designed to compare the input current with the reference current and/or to compare a variable characterizing the input current with a variable characterizing the reference current, wherein, for example, the comparator device B2 is designed to output an output signal based on the comparison, c) a current discharge device B3, which is designed to discharge a current at least temporarily, for example at least temporarily to a first reference potential, for example a ground potential, d) an inverter device B4, which is designed to invert an, or the, output signal at least once, e) a first current output device B5, which is designed to output a first current at the first output at least temporarily, for example if the input current is smaller than the reference current, f) a second current output device B6, which is designed to output a second current at the first output at least temporarily, for example if the input current is greater than the reference current.

In further exemplary embodiments, the configuration N' can be used, for example, to implement at least one of the converter stages 110-1, 110-2, 110-3 of the first analog-to-digital converter unit 110, 110a according to further exemplary embodiments, for example to realize aspects of the exemplary sequence according to FIG. 5.

In further exemplary embodiments, FIG. 14, the conversion device B1 has: at least one transistor, for example transistor M10 or a series circuit of at least two transistors M10, M12. In further exemplary embodiments, the at least one transistor M10, M12 is, for example a MOSFET, metal-oxide semiconductor field-effect transistor, for example an N-channel MOSFET. In further exemplary embodiments, further transistors described below by way of example can, for example, also be designed as MOSFETS (N-channel or P-channel, see circuit symbols in FIG. 14).

In further exemplary embodiments, the conversion device B1 can have at least one further transistor, in the present case two MOSFETS M14, M20, for example in series with the aforementioned transistors M10, M12, as a result of which it is possible in further exemplary embodiments to compensate, for example, for a voltage drop at at least one further component of the device N'. For example, the MOSFET M20 can be used to compensate for a voltage drop at the MOSFET M22, which is described in more detail below, and/or the MOSFET M14 can be used to compensate for a voltage drop at the MOSFET M11, which is described in more detail below.

In further exemplary embodiments, the conversion device B1 can have at least one resistor R3 or (for example, alternatively to the resistor R3) a diode, for example Schottky diode, for example in series with the aforementioned transistor(s) M10, M12, as a result of which, in further exemplary embodiments, a voltage difference ("offset") can, for example, be generated between bias voltages that can be generated by means of the conversion device B1, for example based on the reference current I_ref, for example for a, or the, comparator device B2. Thus, the mentioned offset acts, for example, at the circuit nodes N1, N2.

Optionally, the conversion device B1 can have a first fuse F1, which can be used, for example, for simulation purposes of the configuration N' but can be omitted in real circuit implementations.

The optional current source SQ1 symbolizes the reference current I_ref already indicated by the block arrow A3 (for example, corresponding to the reference current 110-1-I_ref for the first converter stage 110-1 according to FIG. 3), which can be fed to the conversion device B1 in further exemplary embodiments. The optional current source SQ1 can, for example, be used, in a manner similar to the optional first fuse F1, for simulation purposes of the configuration N' and can also be omitted in further exemplary embodiments, for example for a real circuit implementation.

In further exemplary embodiments, the comparator device B2 can have at least one transistor M18 or a series circuit of at least two transistors, for example MOSFETs, M18, M13, which can be controlled, for example, by means of the bias voltage(s), which can be generated, for example, by the conversion device B1.

In further exemplary embodiments, the comparator device B2 can have at least one further transistor M11, for example in series with the aforementioned transistor(s) M13, M18, as a result of which it is possible in further exemplary embodiments to compensate, for example, for a voltage drop at at least one further component M16 of the device.

In further exemplary embodiments, the comparator device B2 can have at least one further transistor M22, for example in series with the aforementioned transistor(s) M18, M13, M11, wherein the at least one further transistor M22 is, for example, part of a current mirror circuit, for example to copy a current I-4 flowing through the comparator device B2, for example the input current I_in (or the input current 110-1-1 in for the first converter stage 110-1 according to FIG. 3), for example for a further component B5 of the configuration N'. Further parts of the current mirror circuit having the transistor M22 are, for example, the transistor M23 and/or M28 of the component B5.

In further exemplary embodiments, the comparator device B2 can have at least one further transistor M34, for example to stabilize an input voltage level. The transistor M34 can be controlled, for example, by the optional voltage source V6. For example, the transistor M34 is connected as a source follower (in pnp transistors, corresponding to an emitter follower). Thus, the transistor M34 attempts to maintain a fixed voltage level at the source electrode, which in further exemplary embodiments is also the input to the converter stage. For example, in this case, the transistor M34 becomes conductive if current is allowed to flow from the current source SQ2, and becomes highly resistive if this is no longer the case. As a result, the voltage level at the current source SQ2 remains approximately constant. This is important in further exemplary embodiments, for example for upstream converter stages, since their current output, for example a MOSFET, also depends on the voltage level at the output of this MOSFET.

FIG. 14 also shows a second fuse F2 and a second current source SQ2, both of which are used, for example exclusively, for simulation purposes of the configuration N' in further exemplary embodiments, and which can be omitted in further exemplary embodiments, for example for a real circuit implementation.

In further exemplary embodiments, the current discharge device B3 can have at least one transistor, for example MOSFET, M7, which at least temporarily discharges a current I-5, for example from the comparator device B2. Optionally, a voltage source V7 is provided to control the MOSFET M7. In further exemplary embodiments, the current discharge device B3 can have at least one further transistor, for example MOSFET, M35, which is, for example, part of a current mirror circuit, for example to copy the current A5 flowing through the current discharge device B3, for example the current A5 discharged from the comparator device B2, for example for a further component B6 of the configuration N'. Further parts of the current mirror circuit having the transistor M35 are, for example, the transistor M29 and/or M38 of the component B6.

In further exemplary embodiments, the inverter device B4 can have at least one series circuit of two transistors, for example MOSFETs, M26, M27 and M1, M2, for example two MOSFETs per inverter stage. In the present case, the inverter device B4 accordingly has two inverter stages, for example for reasons of a correct interpretation of the binary output signal out of the configuration or device N' according to FIG. 14.

In further exemplary embodiments, the first current output device B5 can have a first transistor, for example MOSFET, M23, which is part of the current mirror circuit M22, M23, which mirrors, for example, a current I-4 of the comparator device B2 into the first current output device B5. In further exemplary embodiments, the first current output device B5 can have a second transistor, for example MOSFET, M28, which is connected, for example, in parallel with the first transistor M23 of the first current output device B5, and which also mirrors the current I-4 of the comparator device B2 into the first current output device B5, as a result of which the total current mirrored into the first current output device B5 can be doubled, for example.

In further exemplary embodiments, the first current output device B5 can have a third transistor, for example MOSFET, M16, which selectively activates or deactivates the first current output device B5, for example based on the output signal out or a pre-stage out' thereof. In other words, it can be controlled in further exemplary embodiments, based on the signal out', whether a current I-4', which can be mirrored or is mirrored (or multiply mirrored (MOSFET M28) or amplified) by means of current mirrors M22, M23 from the comparator device B2, is to be output as the output current I_out by means of the first current output device B5. For example, in further exemplary embodiments, the first current output device B5 can be activated to output the current I-4' if a binary value "0" is output by the device N'.

In further exemplary embodiments, the second current output device B6 can have a transistor, for example MOSFET, M29, which is part of a current mirror circuit M35, M29, which mirrors, for example, a current I-5 of the current discharge device B3 into the second current output device B6, cf. the block arrow 1-5'. In further exemplary embodiments, the second current output device B6 can have a second transistor, for example MOSFET, M38, which is connected, for example, in parallel with the first transistor M29 of the second current output device B6, and which also mirrors the current I-5 of the current discharge device B3 into the second current output device B6, as a result of which the total current I-5' mirrored into the second current output device B6 can be doubled, for example. For example, in further exemplary embodiments, the second current output device B6 can be activated to output the current I-5' if a binary value "1" is output by the device N'.

In further exemplary embodiments, the current source SQ2 provides an input current for a simulation of the circuit N' according to FIG. 14, wherein the current source SQ2 is used, for example exclusively, for an individual simulation of the circuit N'. In further exemplary embodiments with multiple blocks or stages, the current source SQ2 can be omitted, for example, and the current from a preceding block can be provided instead, for example.

Optionally, the configuration N' according to FIG. 14 can have a third fuse F3, which can be used, for example, for simulation purposes of the configuration N' but can be omitted for real circuit implementations.

The optional voltage source V3' can be used, for example, for a simulation of the circuit N' according to FIG. 14, wherein it characterizes an input of a subsequent block or a subsequent stage.

FIG. 15 shows an exemplary configuration P' for a circuit realization of aspects of a converter stage 110-1, 110-2, 110-3, ... of the first analog-to-digital converter unit 110, 110a according to further exemplary embodiments, for example for realizing aspects of the exemplary sequence according to FIG. 5, in a second polarity configuration, type "P." In further exemplary embodiments, it should be noted that the polarity configurations "N," "P" shown in FIGS. 14, 15 are to be distinguished from the types TYP-1, TYP-2 of the analog-to-digital converter units 110, 110a, 120, 120a.

In further exemplary embodiments, the blocks or components B1', B2', B3', B4', B5', B6' according to FIG. 15 correspond to the blocks or components B1, B2, B3, B4, B5, B6 according to FIG. 14.

In further exemplary embodiments, the conversion device B1' has: at least one transistor M7 or a series circuit of at least two transistors M7, M11. In further exemplary embodiments, the at least one transistor M7, M11 is, for example a MOSFET, metal-oxide semiconductor field-effect transistor, for example a P-channel MOSFET. In further exemplary embodiments, further transistors described below by way of example can, for example, also be designed as MOSFETs (N-channel or P-channel, see circuit symbols in FIG. 15).

In further exemplary embodiments, the conversion device B1' can have at least one further transistor, in the present case two MOSFETS M3, M4, for example in series with the aforementioned transistors M7, M11, as a result of which it is possible in further exemplary embodiments to compensate, for example, for a voltage drop at at least one further component of the device P'. For example, the MOSFET M4 can be used to compensate for a voltage drop at the MOSFET M9, which is described in more detail below, and/or the MOSFET M3 can be used to compensate for a voltage drop at the MOSFET M5, which is described in more detail below.

In further exemplary embodiments, the conversion device B1' can have at least one resistor R1 or (for example, alternatively to the resistor R1) a diode, for example Schottky diode, for example in series with the aforementioned transistor(s) M7, M11, as a result of which, in further exemplary embodiments, a voltage difference ("offset") can, for example, be generated between bias voltages that can be generated by means of the conversion device B1', for example based on the reference current I-6, for example for a, or the, comparator device B2'. Thus, the mentioned offset acts, for example, at the circuit nodes N1', N2'.

Optionally, the conversion device B1' can have a fuse F4, which can be used, for example, for simulation purposes of the configuration P' but can be omitted in real circuit implementations.

The optional current source SQ1' symbolizes the reference current I_ref already indicated by the block arrow I-6 (for example, corresponding to the reference current 110-1–I_ref for the first converter stage 110-1 according to FIG. 3), which can be fed to the conversion device B1' in further exemplary embodiments. The optional current source SQ1' can, for example, be used, in a manner similar to the optional fuse F4, for simulation purposes of the configuration P' and can also be omitted in further exemplary embodiments, for example for a real circuit implementation.

In further exemplary embodiments, the comparator device B2' can have at least one transistor M2 or a series circuit of at least two transistors, for example MOSFETs, M2, M16, which can be controlled, for example, by means of the bias voltage(s), which can be generated, for example, by the conversion device B1'.

In further exemplary embodiments, the comparator device B2' can have at least one further transistor M9, for example in series with the aforementioned transistor(s) M2, M16, as a result of which it is possible in further exemplary embodiments to compensate, for example, for a voltage drop at at least one further component M8 of the device P'.

In further exemplary embodiments, the comparator device B2' can have at least one further transistor M5, for example in series with the aforementioned transistor(s) M2, M16, M9, wherein the at least one further transistor M5 is, for example, part of a current mirror circuit, for example to copy a current I-7 flowing through the comparator device B2', for example the input current I_in, for example for a further component B5' of the device P+. Further parts of the current mirror circuit having the transistor M5 are, for example, the transistor M15 and/or M6 of the component B5'.

In further exemplary embodiments, the comparator device B2' can have at least one further transistor M9, for example to stabilize an input voltage level.

FIG. 15 also shows a fuse F5 as well as a current source SQ2' and a resistor R', both of which are used, for example exclusively, for simulation purposes of the configuration P' in further exemplary embodiments, and which can be omitted in further exemplary embodiments, for example for a real circuit implementation.

In further exemplary embodiments, the current discharge device B3' can have at least one transistor, for example MOSFET, M1, which at least temporarily discharges a current I-8, for example from the comparator device B2'. Optionally, a voltage source V2' is provided to control the MOSFET M1. In further exemplary embodiments, the current discharge device B3' can have at least one further transistor, for example MOSFET, M13, which is, for example, part of a current mirror circuit, for example to copy the current I-8 flowing through the current discharge device B3', for example the current I-8 discharged from the comparator device B2', for example for a further component B6' of the device. Further parts of the current mirror circuit having the transistor M1 are, for example, the transistor M10 and/or M11 of the component B6'.

In further exemplary embodiments, the inverter device B4' can have at least one series circuit of two transistors, for example MOSFETs, M17, M19. In the present case, the inverter device B4' accordingly has an inverter stage, for example in contrast to the inverter device B4 according to FIG. 12.

In further exemplary embodiments, the first current output device B5' according to FIG. 15 can have a first transistor, for example MOSFET, M15, which is part of the current mirror circuit M5, M15, which mirrors, for example, a current I-7 of the comparator device B2' into the first current output device B5'. In further exemplary embodiments, the first current output device B5' can have a second transistor, for example MOSFET, M6, which is connected, for example, in parallel with the first transistor M15 of the first current output device B5', and which also mirrors the current I-7 of the comparator device B2' into the first current output device B5', as a result of which the total current I-7' mirrored into the first current output device B5' can be doubled, for example.

In further exemplary embodiments, the first current output device B5' can have a third transistor, for example MOSFET, M8, which selectively activates or deactivates the first current output device B5', for example based on the output signal out. In other words, it can be controlled in further exemplary embodiments, based on the signal out, whether a current I-7', which can be mirrored or is mirrored (or multiply mirrored (MOSFET M26) or amplified) by means of current mirrors M5, M15 from the comparator device B2', is to be output as the output current I_out by means of the first current output device B5'. For example, in further exemplary embodiments, the first current output device B5' can be activated to output the current A4' if a binary value "0" is output by the device P'.

In further exemplary embodiments, the second current output device B6' can have a transistor, for example MOSFET, M10, which is part of a current mirror circuit M10, M13, which mirrors, for example, a current I-8 of the current discharge device B3' into the second current output device B6', cf. the block arrow I-8'. In further exemplary embodiments, the second current output device B6' can have a second transistor, for example MOSFET, M14, which is connected, for example, in parallel with the first transistor M10 of the second current output device B6', and which also mirrors the current I-8 of the current discharge device B3' into the second current output device B6', as a result of which the total current I-8' mirrored into the second current output device B6' can be doubled, for example. For example, in further exemplary embodiments, the second current output device B6' can be activated to output the current I-8' if a binary value "1" is output by the device P'.

Optionally, for example for simulation purposes, a resistor R2 can be provided in the block B3', which can, for example, accelerate a simulation process, and which can be omitted in a real circuit implementation.

In further exemplary embodiments, it is provided that the device P+ of the second polarity configuration is designed to receive an input current I_in flowing from a second reference potential BP2, VDD, which is different from a, or the, first reference potential BP1, for example an operating voltage potential associated with an operating voltage VDD, and to output the output current I_out to the second reference potential, for example operating voltage potential.

Optionally, the configuration P' according to FIG. 15 can have at least one further fuse F6, F7, which can be used, for example, for simulation purposes of the configuration P' but can be omitted in real circuit implementations.

The optional voltage source V3' can be used, for example, for a simulation of the circuit P' according to FIG. 15, wherein it characterizes an input of a subsequent block or a subsequent stage or maps its effect.

In the following, aspects of operation of the component N' according to FIG. 14 are described by way of example, which can also be applied in an analogous manner to the component P' according to FIG. 15.

As long as the output signal out is zero, i.e., the input current I_in or I-4 is smaller than the reference current I_ref or I-3, the input current I_in is output as the output current (see, for example, block 222 according to FIG. 5), which is performed, for example, by means of the transistors M22, M23 in further exemplary embodiments.

In further exemplary embodiments, the component B5 is deactivated as soon as the output signal out indicates a value "1" or "High," which is performed, for example, by the transistor M16. Due to the non-vanishing resistance of the transistor M16 (or its drain-source path) in the switched-on state (RDS_on), a voltage drop occurs at the drain-source path of the transistor M16, which in further exemplary embodiments can be compensated for, for example, in the conversion device B1 and in the comparator device B2, for example by means of the transistors M11, M14. In further exemplary embodiments, the transistors M11, M14 can be operated as resistors and can, in further exemplary embodiments, also be replaced by a resistor, for example with the value RDS_on of the transistor M16. However, in further exemplary embodiments, MOSFETs are used as transistors M11, M14, which can contribute to better thermal stability.

As long as the output signal is one (i.e., "High"), i.e., the input current I_in is greater than the reference current I_ref, the reference current I_ref is subtracted from the input current I_in, and only the remaining differential current A5' is output as the output current, which can be controlled, for example, by the transistor M7 of the block B3. For example, the transistor M7 switches on as soon as the potential at its source electrode (and at its output or drain electrode) rises. In further exemplary embodiments, a current I-4 corresponding to the reference current I_ref continues to flow through the comparator device B2, while a current I-5 exceeding the current I-4 is discharged through the transistor M7 of the current discharge device B3. This current A5 is then mirrored by means of the current mirror M35, M29 and leaves the circuit N' as the output current I_out.

In further exemplary embodiments, the transistors M28 and M33 enable amplification, for example doubling, of the output current. In further exemplary embodiments, these transistors M28 and M33 can be selectively activated or deactivated, for example by means of at least one fuse F3a, F3b. Thus, in further exemplary embodiments based on the same circuit layout N', both devices with amplified output current (M28 and/or M38 active) and devices with non-amplified output current (M28 and/or M38 inactive) can be efficiently provided. The optional output current amplification can, for example, be used in further exemplary embodiments in converter stages, for example for stages or devices which are further away from the input in a series circuit and operate with lower current intensities due to the above-described operating principle according to exemplary embodiments, and in which, for example, a non-vanishing capacitance of the gate electrode of the real MOSFETs affects the relevant current signal waveforms.

In further exemplary embodiments, a width of the gate electrode of the primary transistor M23 can, for example, be increased, e.g., doubled, as an alternative or supplement to a second transistor M28, in order to achieve a desired output current amplification.

In further exemplary embodiments, the comparator device B2 (FIG. 14) is controlled by the conversion device B1, for example by means of a bias voltage.

In further exemplary embodiments, the transistor M12 provides the bias voltage for the transistor M13. In further exemplary embodiments, the transistor M10 provides the bias voltage for the transistor M18. In further exemplary embodiments, the bias voltage for the transistor M18 is somewhat greater, for example between approximately 20 millivolts, mV, and approximately 200 mV, than the bias voltage for the transistor M13. This offset can be provided, for example, by the optional resistor R3, which can also be replaced in further exemplary embodiments by a diode, e.g., a Schottky diode.

In further exemplary embodiments, an advantage of the configuration N' according to FIG. 14 described, by way of example, above is that, if the input current I_in reaches the current intensity of the reference current I_ref, the potential of the drain electrode of the transistor M13 will rise because the transistor M13 can no longer provide the required current intensity. As soon as this rise in the potential of the drain electrode of the transistor M13 exceeds the offset applied across the resistor R3, the transistor M18 begins to switch off, which further accelerates the rise in the potential of the drain electrode of the transistor M13. As a result, a comparatively precise and steep flank can thereby be achieved in further exemplary embodiments. According to investigations by the applicant, this works comparatively well in further exemplary embodiments, in particular at currents in the milliampere (mA) range, while the optional components R3, M10, M18 can be omitted in further exemplary embodiments, for example for smaller currents, for example in the range of a few nanoamperes, nA.

In further exemplary embodiments, the conversion device B1 can also be influenced, for example, to provide a nominal bias voltage for the comparator device B2 based on half the reference current I_ref. In further exemplary embodiments, this can be achieved, for example, by modifying the dimensions of the gate electrodes of MOSFETs M12, M10 or MOSFETs M18, M13. In further exemplary embodiments, the same bias voltage can, for example, be used for a plurality of devices N' or 100, . . . of, for example, a same A/D converter device and/or mutually adjacent A/D converter devices, in which case, for example, only one reference current I_ref is required.

In further exemplary embodiments, the device N' or P' can, for example, use an additional current mirror, which, to be sure, increases an electrical power consumption but allows a current direction of the input current to be adjusted to coincide with the current direction of the output current. In these embodiments, devices each having the same type of polarity configuration N or P can, for example, be used for a converter device, i.e., a plurality of converter stages 110-1, 110-2, 110-3 of the same polarity configuration can, for example, be provided. Alternatively, in further exemplary embodiments, it can be provided that at least two successive converter stages 110-1, 110-2 have a respectively different polarity configuration P, N, for example according to FIGS. 14, 15, wherein, for example, a plurality of, for example all, respectively successive converter stages have a respectively alternating polarity configuration P, N, P, . . . , wherein, for example, the respective polarity configuration corresponds to a position of the respective converter stage in a series circuit. In further exemplary embodiments, this can help reduce a complexity of the individual converter stages (for example, with respect to optional additional current mirrors) and an electrical power consumption.

In further exemplary embodiments, the device N' or its inverter device B4 can have one inverter stage M26, M27, instead of two inverter stages, wherein the inverted state of the output signal out' can possibly be taken into account by a target system 110-1, 110-2, . . . of the device N'.

In further exemplary embodiments, it is also possible to arrange a plurality of devices N', P' "one above the other" with respect to an electrical reference potential, for example to stack them, wherein, for example, a first device has the ground potential as the reference potential and an operating voltage of, for example, 0.5 volt, while a second device has the potential of 0.5 volt (relative to the ground potential) as the reference potential and an operating voltage of 1.0 volt, etc. In these embodiments, it can be possible, for example, to dispense with internal current mirrors of the devices because the output current of each device would leave the respective device in the same direction as the direction of the input current of the respective device. In other words, in these embodiments, an entire circuit could be supplied by the current to be measured or the input current I_in.

Figure 16:
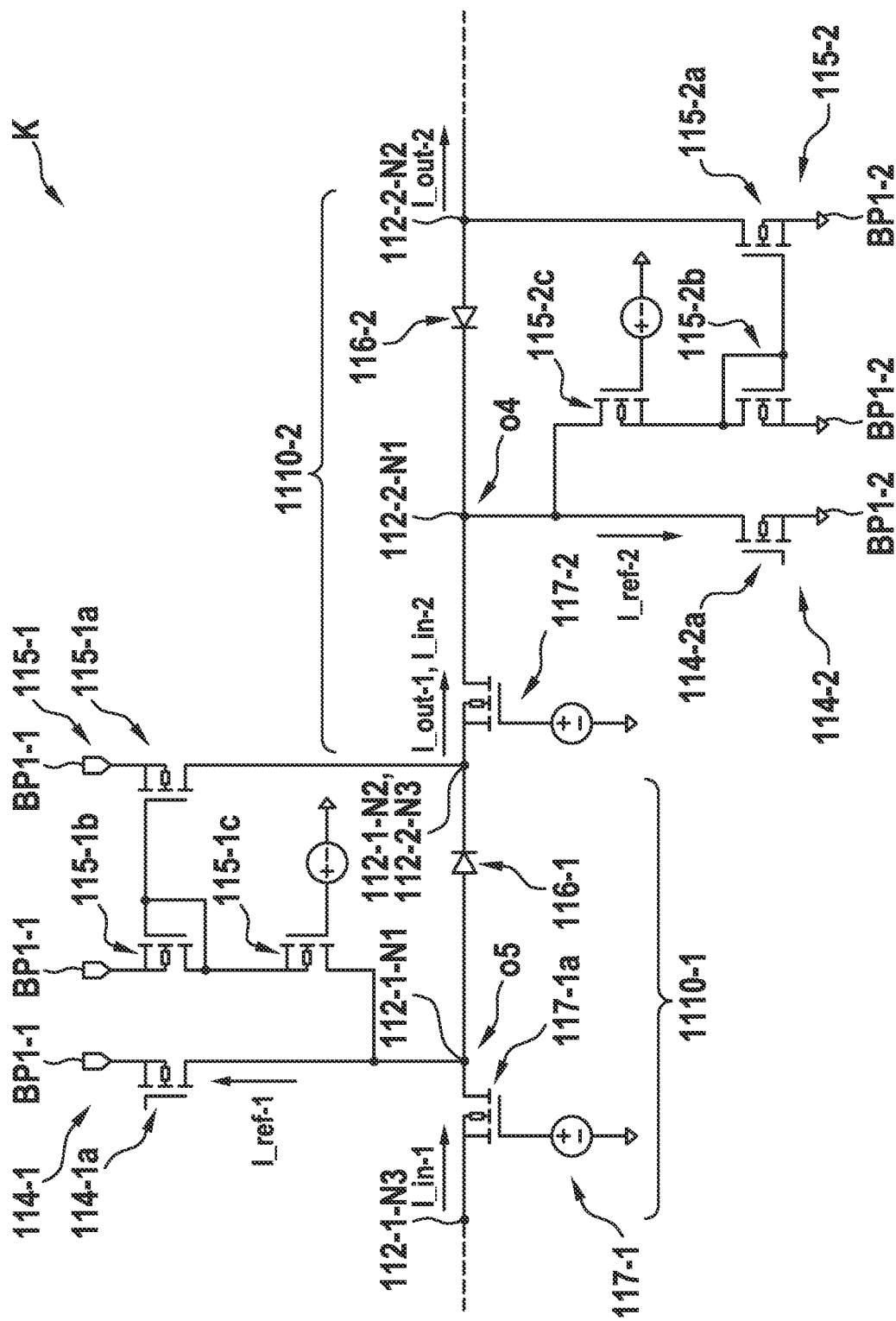
FIG. 16 schematically shows a simplified circuit diagram according to exemplary embodiments of the present invention.

FIG. 16 shows an exemplary configuration K of aspects for converter stages 110-1, 110-2, . . . (FIGS. 3, 7) of the first analog-to-digital converter unit 110, 110a according to further exemplary embodiments, for example for realizing aspects of the exemplary sequence according to FIG. 6, in which aspects Gray coding can be realized, for example. Shown here, by way of example, are two comparator devices 1110-1, 1110-2 connected in series with one another, wherein, for example, the first comparator device 1110-1 can be used for the first converter stage 110-1 according to FIGS. 3, 7, and wherein, for example, the second comparator device 1110-2 can be used for the second converter stage 110-2 according to FIGS. 3, 7.

To the configuration K according to FIG. 16, an input current can be fed at the third circuit node 112-1-N3 of the first comparator device 1110-1 as the first input current I_in-1 (for example, the input current I_in according to FIGS. 1, 3; for example, the input current 110-1–I_in according to FIG. 3) for the first comparator device 1110-1, which compares the first input current I_in-1 with the first reference current I_ref-1 (for example, analogous to the reference current 110-1–I_ref according to FIG. 3) and provides, at its first circuit node 112-1-N1, an electrical potential characterizing the comparison result, as an output signal o5 (see also element o5 according to FIG. 7).

In further exemplary embodiments, FIG. 16, it is provided that a first reference current device 114-1 has a transistor 114-1a, e.g., field-effect transistor, whose load path (drain-source path) is connected between the first circuit node 112-1-N1 and a first reference potential BP1-1 of the first comparator device 1110-1. Thus, in further exemplary embodiments, a first reference current I_ref-1 can be efficiently provided. In further exemplary embodiments, a current intensity of the first reference current I_ref-1 can be predetermined or influenced by at least one of the following elements: a) an actuation of the transistor 114-1a, b) dimensions of at least one component of the transistor 114-1a, e.g., gate width in the case of a field-effect transistor.

In further exemplary embodiments, the transistor 114-1a can be part, for example an output, of a current mirror device that provides the first reference current I_ref-1.

In further exemplary embodiments, FIG. 16, it is provided that a first differential current provision device 115-1 has a first transistor 115-1a, e.g., field-effect transistor, whose load path is connected between the second circuit node 112-1-N2 and a, or the, first reference potential BP1-1 of the first comparator device 1110-1.

In further exemplary embodiments, it is provided that the first transistor 115-1a of the first differential current provision device 115-1 can be actuated based on an electrical potential of the first circuit node 112-1-N1 of the first comparator device 1110-1, i.e., for example, based on a comparison result of the first comparator device 1110-1.

For example, the first transistor 115-1a of the first differential current provision device 115-1 can form, together with a second transistor 115-1b of the first differential current provision device 115-1, a current mirror device, which can be controlled, for example, by means of a third transistor 115-1c of the first differential current provision device 115-1, for example based on the electrical potential of the first circuit node 112-1-N1 of the first comparator device 110-1. In this way, as soon as the first input current I_in-1 exceeds the first reference current I_ref-1 and thus a potential change occurs at the first circuit node 112-1-N1, the first transistor 115-1a of the first differential current provision device 115-1 can be efficiently caused to henceforth provide the first output current I_out-1.

Further aspects of operation of the comparator device 1110-1 according to FIG. 16 are described below by way of example, with reference to the exemplary time diagram according to FIG. 17 as well.

At point in time t0, the first input current I_in-1 is zero and, after point in time t0, the first input current I_in-1 increases until point in time t1, in this example linearly, cf. the curve K1. The curve K2 characterizes the first output current I_out-1 of the first comparator device 1110-1 according to FIG. 16. From FIG. 17, it can be seen that the first output current K2 is equal to the first reference current I_ref-1 at point in time t0, and that the first output current K2 then drops linearly to zero until point in time t01, at which the first input current I_in-1, K1 exceeds the first reference current I_ref-1. The output signal o51 at the first circuit node 112-1-N1, cf. the curve K3 according to FIG. 17, has a first state, e.g., logic one, between t0 and t01, for example based on the first operating voltage potential BP1-1 of the first comparator device.

As soon as the first input current I_in-1, K1 exceeds the first reference current I_ref-1, see the point in time t01 according to FIG. 17, the output signal o5, K3 assumes a second state, e.g., logic zero, and while the first input current I_ein-1, K1 continues to increase until the point in time t1, the first output current I_out-1, K2 also increases in a corresponding manner. It can be seen that even with a state transition of the output signal o5, K3, see, for example, the point in time t01, no abrupt change of the first output current K2 occurs, but the temporal change of the first output current K2 is based on the temporal change of the first input current K1.

For example, the diode 116-1 according to FIG. 16 is conductive during the period of time from t0 to t01 and is blocking during the period of time from t01 to t10. In further exemplary embodiments, the first differential current provision device 115-1 can provide the first output current I_out-1, while the diode 116-1 is blocking.

In the present case, the first comparator device 1110-1 according to FIG. 16 has been realized, by way of example, by means of p-channel field-effect transistors, for example of the MOSFET type, while the second comparator device 1110-2 according to FIG. 16 is realized by means of n-channel MOSFETs. Such an alternating realization of the MOSFETS of successive comparator devices 1110-1, 1110-2, . . . of the configuration K can be advantageous in further exemplary embodiments because it requires fewer components than an embodiment in which all transistors of the comparator devices 1110-1, 1110-2, . . . are of the same type, e.g., p-type or n-type. It can also reduce a number of cross-currents between adjacent comparator devices.

The function of the second comparator device 1110-2 according to FIG. 16 corresponds substantially to the function of the first comparator device 1110-1 according to FIG. 16, with the difference that the MOSFETs of the second comparator device 1110-2 are, by way of example, of the n-channel type in the present case.

For example, it is provided that the second reference current device 114-2 has a transistor 114-2a, e.g., field-effect transistor, whose load path (drain-source path) is connected between the first circuit node 112-2-N1 and a first reference potential BP1-2 of the second comparator device 1110-2. Thus, in further exemplary embodiments, a second reference current I_ref-2 can be efficiently provided. In further exemplary embodiments, a current intensity of the second reference current I_ref-2 can be predetermined or influenced by at least one of the following elements: a) an actuation of the transistor 114-2a, b) dimensions of at least one component of the transistor 114-2a, e.g., gate width in the case of a field-effect transistor.

In further exemplary embodiments, FIG. 16, it is provided that the second differential current provision device 115-2 has a first transistor 115-2a, e.g., field-effect transistor, whose load path is connected between the second circuit node 112-2-N2 and a, or the, first reference potential BP1-2 of the second comparator device 1110-2.

In further exemplary embodiments, it is provided that the first transistor 115-2a of the second differential current provision device 115-2 can be actuated based on an electrical potential of the first circuit node 112-2-N1 of the second comparator device 1110-2, i.e., for example, based on a comparison result of the second comparator device 1110-2, see the output signal o4.

For example, the first transistor 115-2a of the second differential current provision device 115-2 can form, together with a second transistor 115-2b of the second differential current provision device 115-1, a current mirror device that can be controlled, for example, by means of a third transistor 115-2c of the second differential current provision device 115-2, for example based on the electrical potential of the first circuit node 112-2-N1 of the second comparator device 1110-2. In this way, as soon as the second input current I_in-2 exceeds the second reference current I_ref-2 and thus a potential change occurs at the first circuit node 112-2-N1, the first transistor 115-2a of the second differential current provision device 115-2 can be efficiently caused to henceforth provide the second output current I_out-2.

In further exemplary embodiments, the configuration K according to FIG. 16 can, for example, have a third comparator device (not shown here), which is constructed, for example, comparably to the first comparator device 110-1 and is realized, for example, in the same way as the first comparator device 110-1 by means of p-channel MOSFETs. In further exemplary embodiments, the third comparator device can, for example, be used to realize the third converter stage 110-3 (FIG. 7). In further exemplary embodiments, the configuration K according to FIG. 16 can, for example, also have a fourth comparator device (not shown here), which is constructed, for example, comparably to the second comparator device 1110-2 and is realized, for example, in the same way as the second comparator device 1110-2 by means of n-channel MOSFETs, etc., wherein an alternating realization of successive comparator devices 1110-1, 1110-2 by means of MOSFETS of different types (p-channel, n-channel) can be advantageous.

In further exemplary embodiments, the first comparator device 1110-1 according to FIG. 16 can, for example, be used to realize the first converter stage 110-1 (FIG. 7), and the second comparator device 1110-2 according to FIG. 16 can be used to realize the second converter stage 110-2 (FIG. 7), etc. In other words, in further exemplary embodiments, the configuration K according to FIG. 16 can be used to provide one or more converter stages 110-1, 110-2, . . . for the first analog-to-digital converter unit 110, 110a, for example for outputting a Gray-coded portion AS-dig-1 of the digital output signal AS-dig.

In further exemplary embodiments, alternative circuit implementations, e.g., of at least one of the embodiments described above by way of example, can be provided, for example in the sense of inverse circuits, in which, for example, an NMOS component is exchanged for a PMOS component, and vice versa, for example with a corresponding change in an assignment of electrical reference potentials.

In further exemplary embodiments, the first analog-to-digital converter unit 110, 110a and/or the second analog-to-digital converter unit 120, 120a can have a different number of stages or bits than described by way of example above.

In further exemplary embodiments, circuit implementations can also have semiconductor elements, e.g., transistors, of types other than the MOSFET type mentioned by way of example above, e.g., bipolar transistors.

In further exemplary embodiments, one or more resistors can be provided, for example, connected to respective gate electrodes of MOSFET transistors, in order to, for example, suppress a tendency to oscillate.

SPONSORSHIP AND SUPPORT INFORMATION

The project that has led to this application was sponsored by the joint venture ECSEL (JU) within the framework of sponsorship agreement no. 826655. The JU is supported by the research and innovation program Horizon 2020 of the European Union and Belgium, France, Germany, the Netherlands, Switzerland.

The invention claimed is:

1. An analog-to-digital converter device configured to form a digital output signal based on an input current, comprising:
a first analog-to-digital converter unit of a first type; and
a second analog-to-digital converter unit of a second type;
wherein the first analog-to-digital converter unit is configured to receive the input current, and, based on the input current, form a first portion of the digital output signal, output a first output current to the second analog-to-digital converter unit, and
wherein the second analog-to-digital converter unit is configured to form a second portion of the digital output signal based on the first output current,
wherein the first analog-to-digital converter unit has at least one converter stage, the at least one converter stage being configured to compare a converter stage input current that can be fed to the at least one converter stage, with a converter stage reference current associated with the at least one converter stage, and, based on the comparison: a) output a converter stage output current, and/or b) output a digital converter stage output signal, and
wherein the at least one converter stage is configured to compare the converter stage input current with the converter stage reference current and, when the converter stage input current is smaller than the converter stage reference current, output the converter stage input current as the converter stage output current, and, when the converter stage input current is greater than or equal to the converter stage reference current, output a difference of the converter stage input current and the converter stage reference current, as the converter stage output current.

2. The analog-to-digital converter device according to claim 1, wherein the second type is different from the first type.

3. The analog-to-digital converter device according to claim 1, wherein the at least one converter stage includes a first converter stage and a second converter stage, converter stages, wherein the first converter stage is configured to compare a converter stage input current that can be fed to the first converter stage, with a converter stage reference current associated with the first converter stage, and, based on the comparison: a) output a first converter stage output current as an input current for the second converter stage, and/or b) output a first digital converter stage output signal.

4. The analog-to-digital converter device according to claim 1, wherein the first analog-to-digital converter unit is configured to output the first portion of the digital output signal as a Gray-coded signal.

5. The analog-to-digital converter device according to claim 4, further comprising a transcoding device configured to transcode the Gray-coded signal into a binary-coded signal.

6. The analog-to-digital converter device according to claim 1, further comprising a current mirror device configured to output the first output current to the second analog-to-digital converter unit.

7. The analog-to-digital converter device according to claim 1, wherein the second analog-to-digital converter unit is configured to provide the second portion of the digital output signal as a unary-coded signal.

8. The analog-to-digital converter device according to claim 7, further comprising a transcoding device configured to transcode the unary-coded signal into a binary-coded signal.

9. The analog-to-digital converter device according to claim 1, wherein the first analog-to-digital converter unit and the second analog-to-digital converter unit are arranged on a same semiconductor substrate.

10. The analog-to-digital converter device according to claim 1, wherein the analog-to-digital converter device is used for at least one of the following elements: a) converting a current into a binary value, b) performing a binary encoding, c) providing a completely current-driven hybrid analog-to-digital converter.

11. An analog-to-digital converter device configured to form a digital output signal based on an input current, comprising:
  a first analog-to-digital converter unit of a first type; and a second analog-to-digital converter unit of a second type;
  wherein the first analog-to-digital converter unit is configured to receive the input current, and, based on the input current, form a first portion of the digital output signal output a first output current to the second analog-to-digital converter unit,
  wherein the second analog-to-digital converter unit is configured to form a second portion of the digital output signal based on the first output current,
  wherein the first analog-to-digital converter unit has at least one converter stage, the at least one converter stage being configured to compare a converter stage input current that can be fed to the at least one converter stage, with a converter stage reference current associated with the at least one converter stage, and, based on the comparison: a) output a converter stage output current, and/or b) output a digital converter stage output signal, and
  wherein the at least one converter stage is configured to compare the converter stage input current with the converter stage reference current, and, when the converter stage input current is smaller than the converter stage reference current, output a difference of the converter stage reference current and the converter stage input current as the converter stage output current, and, when the converter stage input current is greater than or equal to the converter stage reference current, output a difference of the converter stage reference current and a difference of the converter stage input current and the converter stage reference current as the converter stage output current.

12. A method for operating an analog-to-digital converter device which is configured to form a digital output signal based on an input current, wherein the analog-to-digital converter device includes a first analog-to-digital converter unit of a first type and a second analog-to-digital converter unit of a second type, wherein the second type is different from the first type, the method comprising:
  receiving, by the first analog-to-digital converter unit, the input current;
  forming, by the first analog-to-digital converter unit, based on the input current, a first portion of the digital output signal;
  outputting, by the first analog-to-digital converter unit, a first output current to the second analog-to-digital converter unit; and
  forming, by the second analog-to-digital converter unit, a second portion of the digital output signal based on the first output current,
  wherein the first analog-to-digital converter unit has at least one converter stage, the at least one converter stage being configured to compare a converter stage input current that can be fed to the at least one converter stage, with a converter stage reference current associated with the at least one converter stage, and, based on the comparison: a) output a converter stage output current, and/or b) output a digital converter stage output signal, and
  wherein the at least one converter stage is configured to compare the converter stage input current with the converter stage reference current and, when the converter stage input current is smaller than the converter stage reference current, output the converter stage input current as the converter stage output current, and, when the converter stage input current is greater than or equal to the converter stage reference current, output a difference of the converter stage input current and the converter stage reference current, as the converter stage output current.

* * * * *